(12) United States Patent
Hoshino et al.

(10) Patent No.: US 11,789,302 B2
(45) Date of Patent: Oct. 17, 2023

(54) LIQUID CRYSTAL COMPOSITION, LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Wataru Hoshino, Kanagawa (JP); Teruki Niori, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 58 days.

(21) Appl. No.: 16/596,019

(22) Filed: Oct. 8, 2019

(65) Prior Publication Data

US 2020/0033663 A1 Jan. 30, 2020

Related U.S. Application Data

(63) Continuation of application No. PCT/JP2018/016618, filed on Apr. 24, 2018.

(30) Foreign Application Priority Data

Apr. 25, 2017 (JP) ................. 2017-085997

(51) Int. Cl.
| | | |
|---|---|---|
| G02F 1/1333 | (2006.01) | |
| C09K 19/60 | (2006.01) | |
| C09K 19/38 | (2006.01) | |
| G02F 1/135 | (2006.01) | |

(52) U.S. Cl.
CPC .... *G02F 1/133365* (2013.01); *C09K 19/3852* (2013.01); *C09K 19/60* (2013.01); *G02F 1/1351* (2021.01); *G02F 2202/043* (2013.01)

(58) Field of Classification Search
CPC ............... C09K 19/38; C09K 19/3833; C09K 19/3852; C09K 19/60; C09K 19/601; C09K 19/603; C09K 19/605; C09K 19/606; C09K 19/608; G02F 1/133365
See application file for complete search history.

(56) References Cited

U.S. PATENT DOCUMENTS

| | | | |
|---|---|---|---|
| 5,546,889 A | 8/1996 | Wakita et al. | |
| 7,427,364 B2 * | 9/2008 | Takaku | C09K 19/60 252/299.1 |
| 7,780,870 B2 * | 8/2010 | Kato | C09K 19/60 252/299.01 |
| 9,318,716 B1 | 4/2016 | Rathnayake | |
| 2002/0076511 A1 * | 6/2002 | Sanada | C09K 19/3852 428/1.1 |
| 2009/0087590 A1 * | 4/2009 | Aiki | C08J 5/18 428/1.1 |
| 2010/0143709 A1 | 6/2010 | Baer et al. | |
| 2010/0149446 A1 | 6/2010 | Fujisawa et al. | |
| 2010/0182543 A1 | 7/2010 | Goto et al. | |
| 2013/0044286 A1 * | 2/2013 | Yoon | G02F 1/13363 349/194 |
| 2013/0107195 A1 | 5/2013 | Morishima et al. | |
| 2014/0142266 A1 | 5/2014 | Sakamoto et al. | |
| 2014/0183410 A1 | 7/2014 | Uemura et al. | |
| 2015/0079380 A1 * | 3/2015 | Muramatsu | C09K 19/2028 428/220 |
| 2016/0109757 A1 * | 4/2016 | Ibaraki | C09K 19/3486 522/39 |

FOREIGN PATENT DOCUMENTS

| | | |
|---|---|---|
| CN | 101194191 A | 6/2008 |
| CN | 101246284 A | 8/2008 |
| CN | 101300307 A | 11/2008 |
| CN | 101646695 A | 2/2010 |
| CN | 101781570 A | 7/2010 |
| CN | 102822705 A | 12/2012 |
| CN | 103492363 A | 1/2014 |
| CN | 103781755 A | 5/2014 |
| CN | 105467652 A | 4/2016 |
| JP | 1-304420 A | 12/1989 |
| JP | 6-273729 A | 9/1994 |
| JP | 7-56151 A | 3/1995 |
| JP | 07-64064 A | 3/1995 |
| JP | 7-206599 A | 8/1995 |
| JP | 8-129163 A | 5/1996 |
| JP | 09-40955 A | 2/1997 |
| JP | 2001-091737 A | 4/2001 |
| JP | 2005-077665 A | 3/2005 |
| JP | 2011-237513 A | 11/2011 |
| JP | 2011237513 A * | 11/2011 |
| JP | 2015105326 A * | 6/2015 |

OTHER PUBLICATIONS

English translation of JP2011237513. (Year: 2011).*
English translation of JP2015105326. (Year: 2015).*
International Search Report issued in PCT/JP2018/016618 dated Jul. 24, 2018.
Written Opinion issued in PCT/JP2018/016618 dated Jul. 24, 2018.
International Preliminary Report on Patentability completed by WIPO dated Oct. 29, 2019 in connection with International Patent Application No. PCT/JP2018/016618.
Office Action, issued by the Japanese Patent Office dated Feb. 2, 2021, in connection with Japanese Patent Application No. 2019-514536.

(Continued)

*Primary Examiner* — Chanceity N Robinson
*Assistant Examiner* — Anna Malloy
(74) *Attorney, Agent, or Firm* — Edwards Neils LLC; Jean C. Edwards, Esq.

(57) ABSTRACT

A liquid crystal composition with which a light absorption anisotropic film having a high alignment degree can be formed. The light absorption anisotropic film is used with the liquid crystal composition, a laminate, and an image display device. The liquid crystal composition contains a linear polymer liquid crystalline compound having a repeating unit; a low-molecular-weight liquid crystalline compound having a maximum absorption wavelength of 390 nm or less in a solution; and a dichroic substance.

12 Claims, No Drawings

(56) References Cited

OTHER PUBLICATIONS

Office Action, issued by the Japanese Patent Office dated Jun. 9, 2020, in connection with Japanese Patent Application No. 2019-514536.
Office Action, issued by the Japanese Patent Office dated Apr. 13, 2021, in connection with Japanese Patent Application No. 2019-514536.
Office Action, issued by the State Intellectual Property Office dated Feb. 10, 2021, in connection with Chinese Patent Application No. 201880026514.0.
Office Action, issued by the State Intellectual Property Office dated Jul. 29, 2021, in connection with Chinese Patent Application No. 201880026514.0.

* cited by examiner

LIQUID CRYSTAL COMPOSITION, LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2018/016618 filed on Apr. 24, 2018, which was published under PCT Article 21(2) in Japanese, and which claims priority under 35 U.S.C. § 119(a) to Japanese Patent Application No. 2017-085997 filed on Apr. 25, 2017. The above applications are hereby expressly incorporated by reference, in their entirety, into the present application.

BACKGROUND OF THE INVENTION

1. Field of the Invention

The present invention relates to a liquid crystal composition, a light absorption anisotropic film, a laminate, and an image display device.

2. Description of the Related Art

In the past, devices which are operated by different principles for each function have been used in a case where an attenuation function, a polarization function, a scattering function, a shielding function, or the like of irradiated light such as laser light and natural light is required.

Therefore, products corresponding to the above-described functions have been manufactured through different manufacturing processes for each function.

For example, in liquid crystal displays (LCDs), a linearly polarizing plate or a circularly polarizing plate is used to control optical activity and a birefringent property in display.

In addition, in organic light emitting diodes (OLEDs), a circularly polarizing plate is used to prevent external light from being reflected.

Iodine has been widely used as a dichroic substance in these polarizing plates (polarizing elements). However, a polarizing element using an organic dye as a dichroic substance instead of iodine has also been examined.

For example, in JP2011-237513A, "a light absorption anisotropic film containing at least one kind of thermotropic liquid crystalline dichroic dye and at least one kind of thermotropic liquid crystalline polymer, in which the mass content of the thermotropic liquid crystalline dichroic dye in the light absorption anisotropic film is 30% or greater" is described (claim 1).

SUMMARY OF THE INVENTION

The inventors have examined the light absorption anisotropic film described in JP2011-237513A, and found that depending on the kind of the thermotropic liquid crystalline polymer used for forming the light absorption anisotropic film, the alignment degree of the light absorption anisotropic film may become insufficient with a reduction in the alignment degree of the dichroic substance and there is room for improvement.

Accordingly, an object of the invention is to provide a liquid crystal composition with which a light absorption anisotropic film having a high alignment degree can be formed, a light absorption anisotropic film which is provided using the liquid crystal composition, a laminate, and an image display device.

The inventors have conducted intensive studies for achieving the object, and as a result, found that a light absorption anisotropic film having a high alignment degree can be formed using, as a liquid crystalline compound to be blended together with a dichroic substance, a linear polymer liquid crystalline compound having a repeating unit in a chemical structure thereof and a predetermined low-molecular-weight liquid crystalline compound having no repeating unit in a chemical structure thereof in combination, and completed the invention.

That is, the inventors have found that the object can be achieved with the following configuration.

[1] A liquid crystal composition comprising: a linear polymer liquid crystalline compound having a repeating unit; a low-molecular-weight liquid crystalline compound having a maximum absorption wavelength of 390 nm or less in a solution; and a dichroic substance.

[2] The liquid crystal composition according to [1], in which the polymer liquid crystalline compound has a repeating unit represented by Formula (1).

[3] The liquid crystal composition according to [2], in which $L^1$ in Formula (1) has an oxyalkylene structure.

[4] The liquid crystal composition according to any one of [1] to [3], in which a melting point of the low-molecular-weight liquid crystalline compound is 200° C. or lower.

[5] A light absorption anisotropic film which is formed using the liquid crystal composition according to any one of [1] to [4].

[6] A laminate comprising: a base; and the light absorption anisotropic film according to [5] provided on the base.

[7] The laminate according to [6], further comprising: a N/4 plate provided on the light absorption anisotropic film.

[8] An image display device comprising: the light absorption anisotropic film according to [5]; or the laminate according to [6] or [7].

According to the invention, it is possible to provide a liquid crystal composition with which a light absorption anisotropic film having a high alignment degree can be formed, a light absorption anisotropic film which is provided using the liquid crystal composition, a laminate, and an image display device.

DESCRIPTION OF THE PREFERRED EMBODIMENTS

Hereinafter, the invention will be described in detail.

The following description of constituent requirements is based on typical embodiments of the invention, but the invention is not limited thereto.

In this specification, a numerical value range expressed using "to" means a range including numerical values before and after "to" as a lower limit value and an upper limit value.

In this specification, the term (meth)acrylic acid is a generic term for "acrylic acid" and "methacrylic acid", and the term (meth)acryloyl is a generic term for "acryloyl" and "methacryloyl".

[Liquid Crystal Composition]

A liquid crystal composition according to the embodiment of the invention contains a linear polymer liquid crystalline compound having a repeating unit, a low-molecular-weight liquid crystalline compound having a maximum absorption wavelength of 390 nm or less in a solution, and a dichroic substance.

According to the embodiment of the invention, the liquid crystal composition can form a light absorption anisotropic film having a high alignment degree. The reason for this is not clear in detail, but roughly presumed as follows.

First, in a case where the polymer liquid crystalline compound and the dichroic substance are made completely compatible with each other without being blended with the low-molecular-weight liquid crystalline compound, the alignment degree of the dichroic substance is thought to be substantially the same as that of the polymer liquid crystalline compound.

Therefore, the reason why the alignment degree of a light absorption anisotropic film to be formed is improved can be thought to be that the compatibility of the dichroic substance with respect to the polymer liquid crystalline compound is lowered (that is, the crystallinity of the dichroic substance is improved) by blending with the low-molecular-weight liquid crystalline compound, and as a result, the alignment degree of the dichroic substance is improved.

[Polymer Liquid Crystalline Compound]

The liquid crystal composition according to the embodiment of the invention contains a linear polymer liquid crystalline compound.

Here, the "polymer liquid crystalline compound" refers to a liquid crystalline compound having a repeating unit in a chemical structure thereof.

Examples of the polymer liquid crystalline compound include the thermotropic liquid crystalline polymer described in JP2011-237513A and the dichroic dye polymer having thermotropic liquid crystallinity described in JP2016-004055A.

The polymer liquid crystalline compound may have a crosslinkable group (for example, an acryloyl group and a methacryloyl group) at a terminal thereof.

Examples of the repeating unit of the polymer liquid crystalline compound include a repeating unit in a poly(meth)acrylic acid ester obtained by polymerization of a (meth)acrylic acid ester; an ethylene glycol unit in a polyethylene glycol obtained by polymerization of an ethylene glycol; and a propylene glycol unit obtained by polymerization of a propylene glycol.

Among these, a repeating unit in a poly(meth)acrylic acid ester obtained by polymerization of a (meth)acrylic acid ester is preferable from the viewpoint of diversity of monomers as raw materials and ease of handling.

Preferable examples of the polymer liquid crystalline compound include a liquid crystalline compound having a repeating unit represented by Formula (1) (hereinafter, also referred to as "repeating unit (1)").

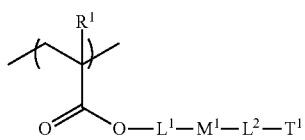

(1)

In Formula (1), $R^1$ represents a hydrogen atom or a methyl group, $L^1$ and $L^2$ each independently represent a single bond or a divalent linking group, $M^1$ represents a mesogenic group represented by Formula (1-1), and $T^1$ represents a terminal group.

The divalent linking groups represented by $L^1$ and $L^2$ in Formula (1) will be described.

Examples of the divalent linking group include an alkylene group having 1 to 30 carbon atoms, and one or more —CH$_2$— moieties constituting the alkylene group may be substituted by —O—, —(CH$_2$)$_n$—, —(CF$_2$)$_n$—, —Si(CH$_2$)$_n$—, —(Si(CH$_3$)$_2$O)$_n$—, —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)—C(Z')—C(O)—S—, —S—C(O)—C(Z)=C(Z')—, —C(Z)=N—N=C(Z')—, —C≡C—, —N=N—, —S—, —S(O)—, —S(OXO)—, —(O)S(O)O—, —O(O)S(O)O—, —SC(O)—, or —C(O)S—. n represents an integer of 1 to 3. Z, Z', and Z" each independently represent a hydrogen atom, an alkyl group having 1 to 4 carbon atoms, a cycloalkyl group, an aryl group, a cyano group, or a halogen atom.

Specific examples of the alkylene group having 1 to 30 carbon atoms include an ethylene group, a propylene group, a butylene group, a pentylene group, a hexylene group, a heptylene group, an octylene group, a nonylene group, a decylene group, an undecylene group, a dodecylene group, a tridecylene group, a tetradecylene group, a pentadecylene group, a hexadecylene group, a heptadecylene group, and an octadecylene group.

The number of carbon atoms of the alkylene group is preferably 1 to 12.

In the invention, $L^1$ in Formula (1) preferably has an oxyalkylene structure in which one or more —CH$_2$— moieties constituting the alkylene group are substituted by —O—.

Examples of the oxyalkylene structure include an oxyethylene structure represented by *—(CH$_2$—CH$_2$O)$_{n1}$—*, an oxypropylene structure represented by *—(CH$_2$—CH$_2$—CH$_2$O)$_{n2}$—* or *—(CH(CH$_3$)—CH$_2$O)$_{n2}$—*, and an oxybutylene structure represented by *—(CH$_2$—CH$_2$—CH$_2$—CH$_2$—CH$_2$O)$_{n3}$—*. n1, n2, and n3 each independently represent an integer of 1 to 20, and * represents a bonding position to an oxygen atom or $M^1$ in Formula (1).

$L^2$ in Formula (1) is preferably a single bond.

Next, the terminal group represented by $T^1$ in Formula (1) will be described.

Specific examples of the terminal group include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, and an ureido group having 1 to 10 carbon atoms. These terminal groups may be further substituted by these groups or the polymerizable groups described in JP2010-244038A.

Next, $M^1$ in Formula (1), that is, the mesogenic group represented by Formula (1-1) will be described.

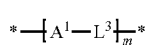

(1-1)

In Formula (1-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$. In a case where m is an integer of 2 to 10, a plurality of A's may be the same or different, and a plurality of $L^3$'s may be the same or different.

The divalent group represented by $A^1$ is preferably a 4- to 6-membered ring.

The divalent group represented by $A^1$ may be monocyclic or condensed.

Examples of the optional substituent of $A^1$ include an alkyl group, a fluorinated alkyl group, and an alkoxy group.

Examples of the divalent aromatic hydrocarbon group represented by $A^1$ include a phenylene group, a naphthylene group, a fluorene-diyl group, an anthracene-diyl group, and a tetracene-diyl group, and from the viewpoint of diversity of the design of a mesogenic skeleton and raw material availability, a phenylene group or a naphthylene group is preferable, and a phenylene group is more preferable.

The divalent heterocyclic group represented by $A^1$ may be aromatic or non-aromatic, and is preferably a divalent aromatic heterocyclic group from the viewpoint of a further improvement in the alignment degree.

Examples of the atoms other than the carbon atom of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different.

Specific examples of the divalent aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by $A^1$ include a cyclopentylene group and a cyclohexylene group.

Examples of the divalent linking group represented by $L^3$ include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$—, —N(Z)—, —C(Z) =C(Z')—, —C(Z)—N—, —N=C(Z)—, —C(Z)$_2$— C(Z')$_2$—, —C(O)—, —OC(O)—, —C(O)O—, —O—C(O) O—, —N(Z)C(O)—, —C(O)N(Z)—, —C(Z)=C(Z')—C (O)O—, —O—C(O)—C(Z)=C(Z')—, —C(Z)=N—, —N=C(Z)—, —C(Z)=C(Z')—C(O)N(Z")—, —N(Z")— C(O)—C(Z)=C(Z')—, —C(Z)=C(Z')—C(O)—S—, —S—C(O)—C(Z)=C(Z')—, —C(Z)=N—N=C(Z')—, —C≡C—, —N=N—, —S—, —S(O)—, —S(O)(O)—, —(O)S(O)O—, —O(O)S(O)O—, —SC(O)—, and —C(O) S—. Groups obtained by combining two or more of the above groups may also be included. g represents an integer of 1 to 10. Z, Z', and Z" each independently represent a hydrogen atom, an alkyl group having 1 to 4 carbon atoms, a cycloalkyl group, an aryl group, a cyano group, or a halogen atom.

Specific examples of $M^1$ include the following structures. In the following specific examples, "Ac" represents an acetyl group.

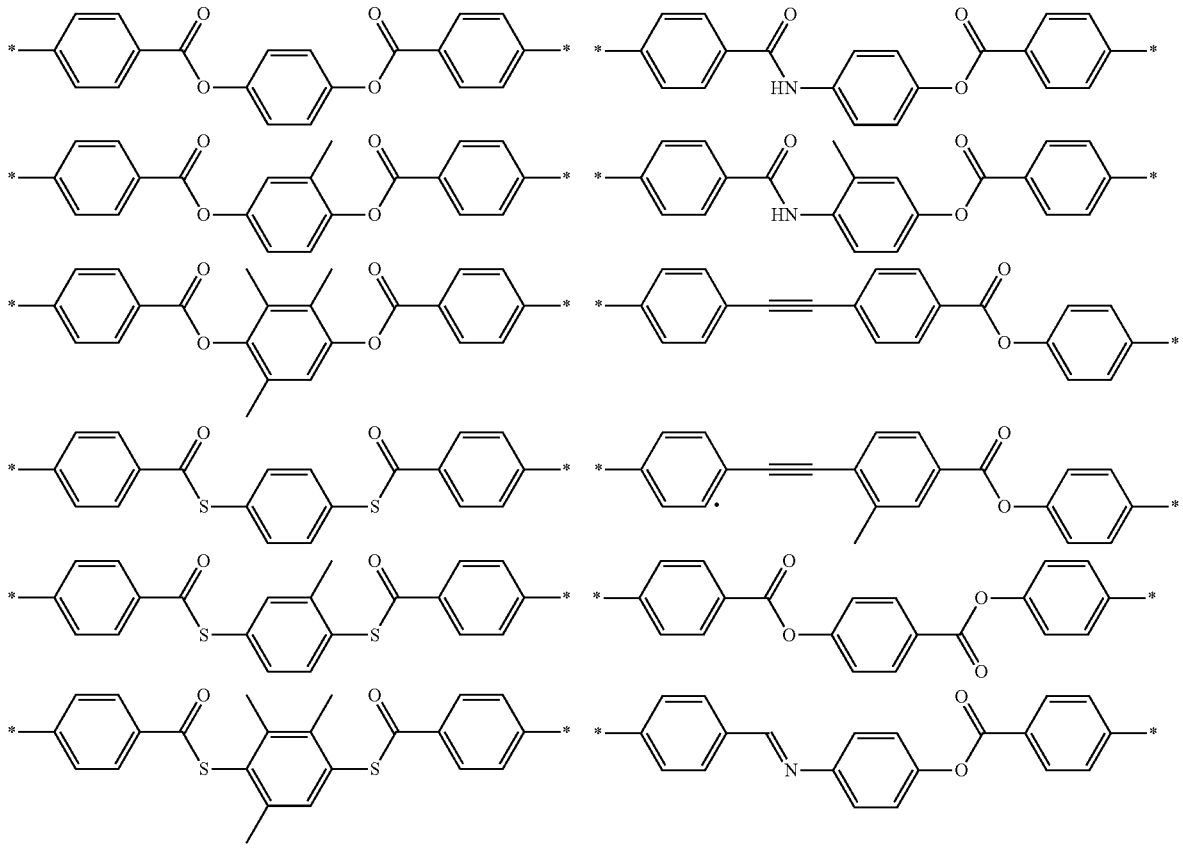

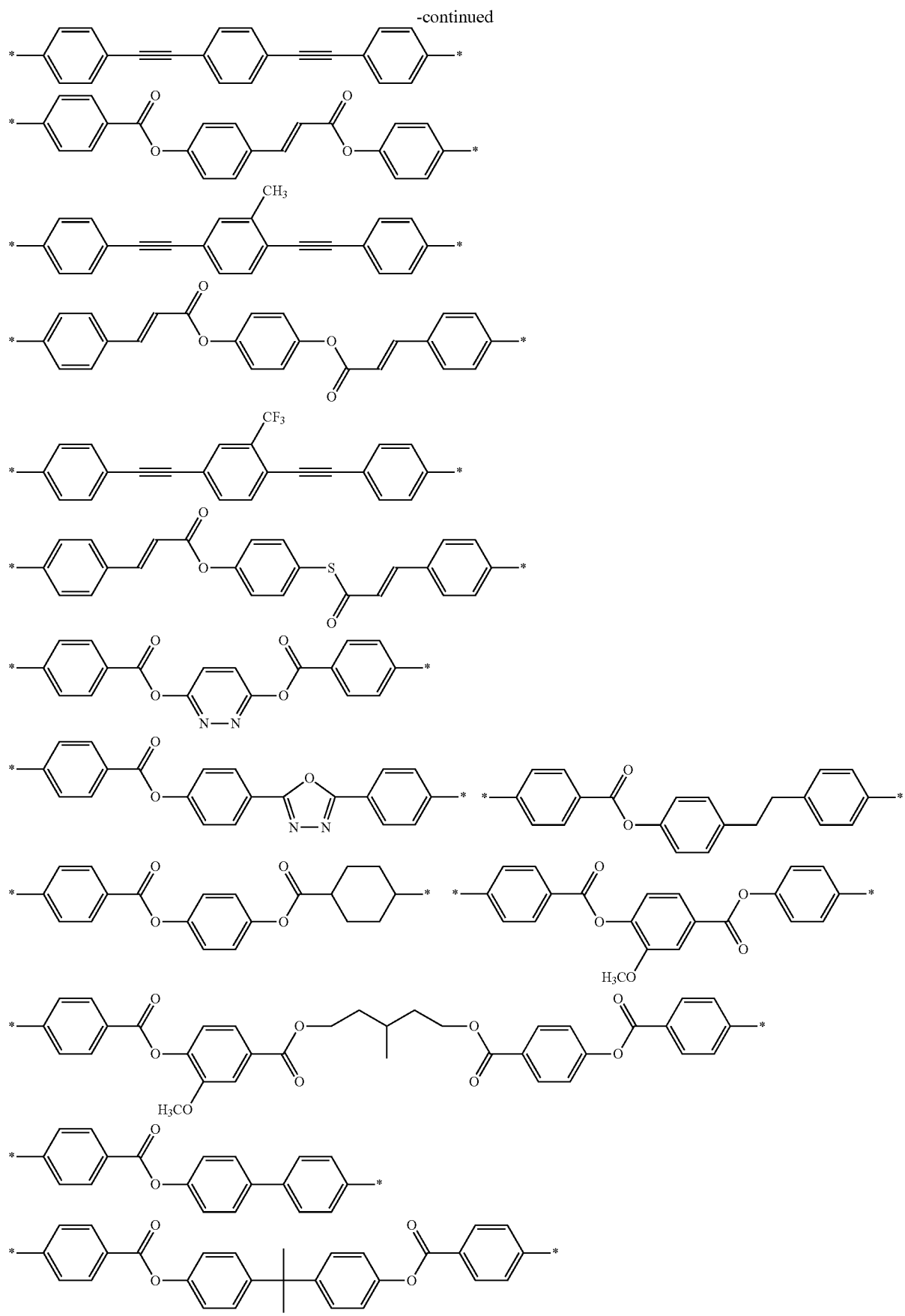

-continued
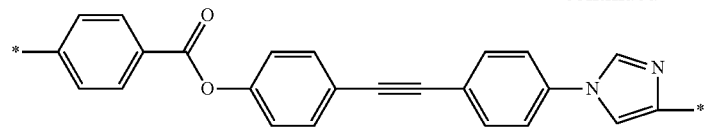
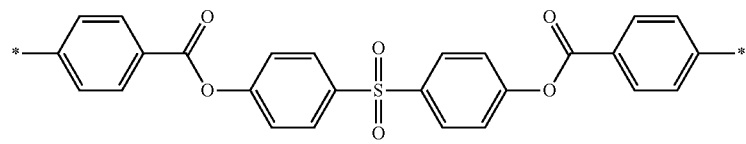
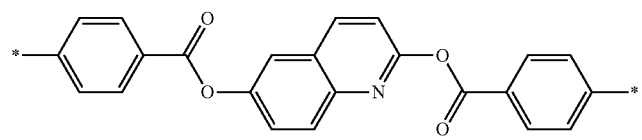
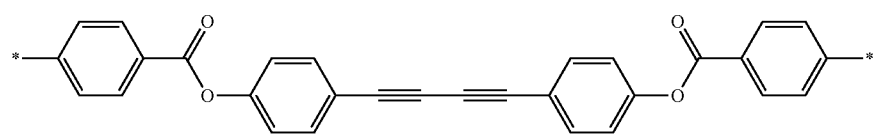
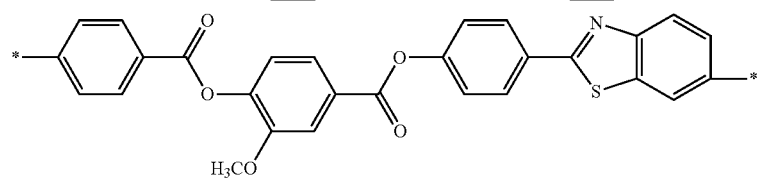
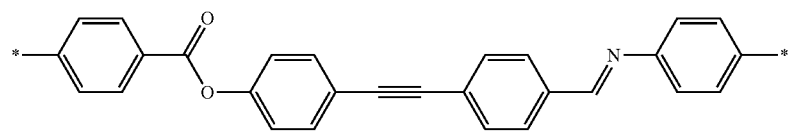
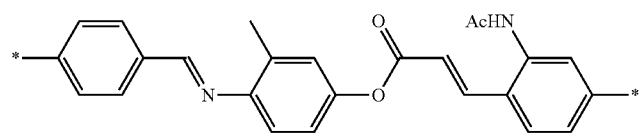
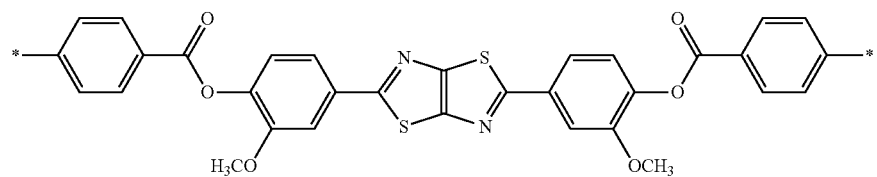
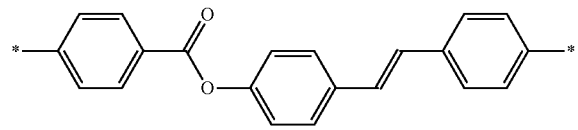
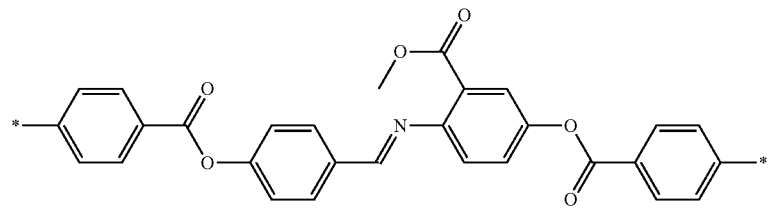
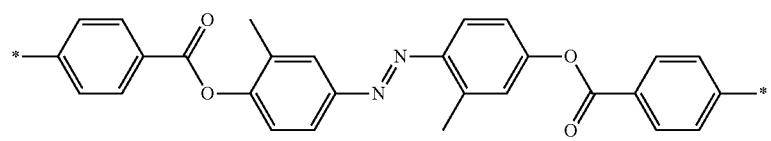

-continued
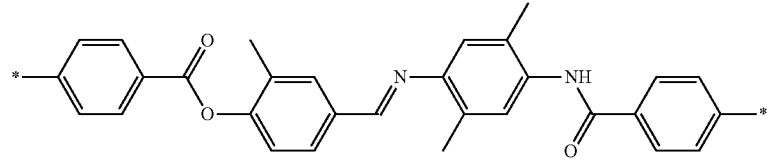
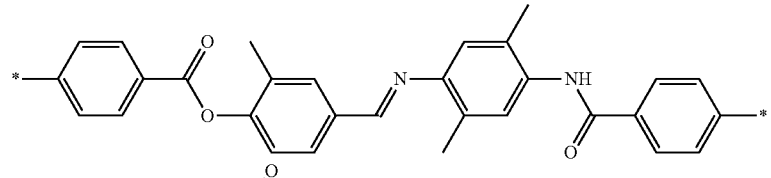
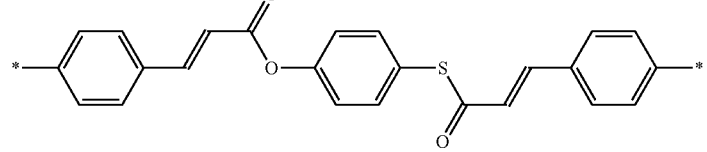
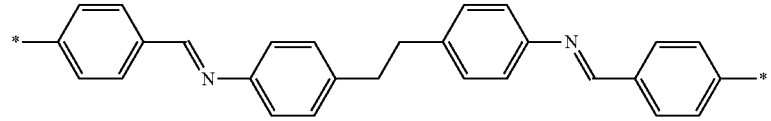
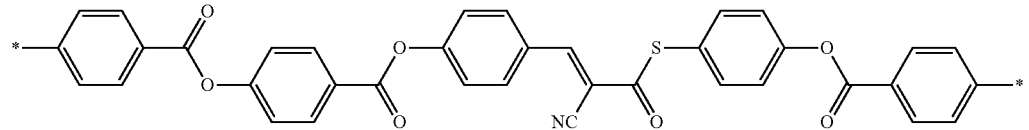
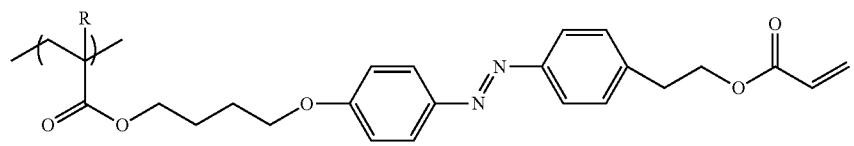
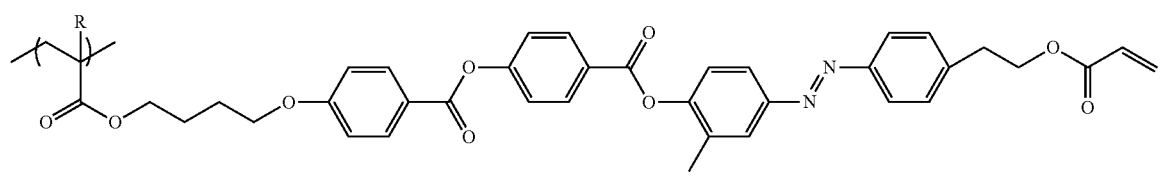
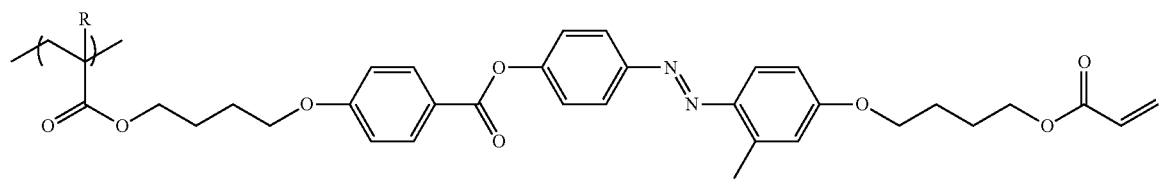
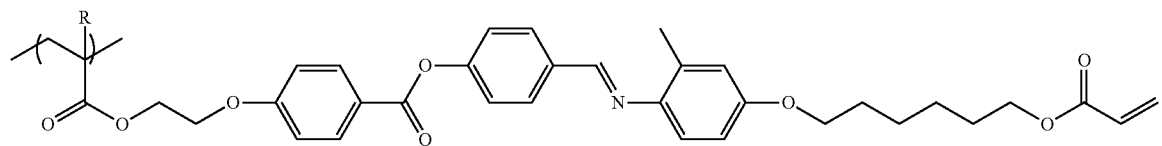
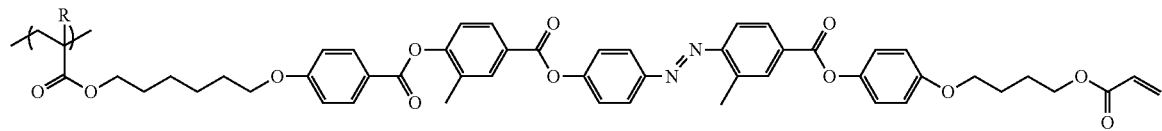

-continued
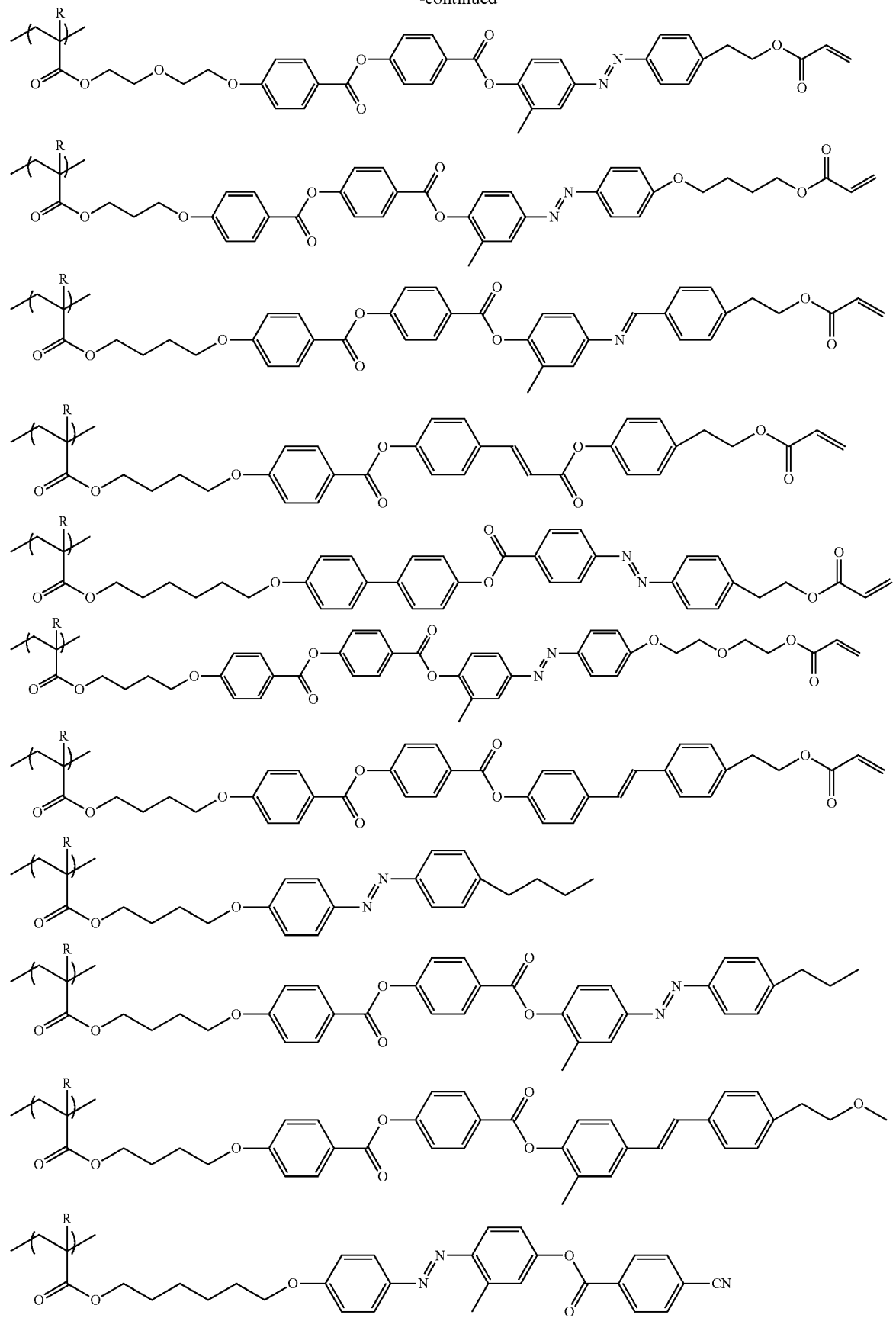

-continued
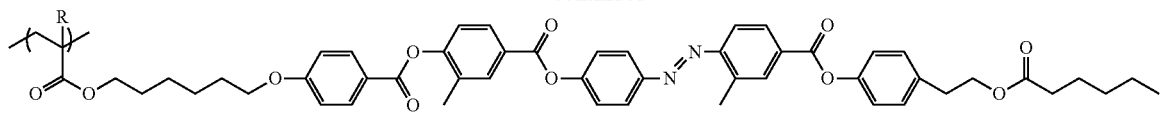
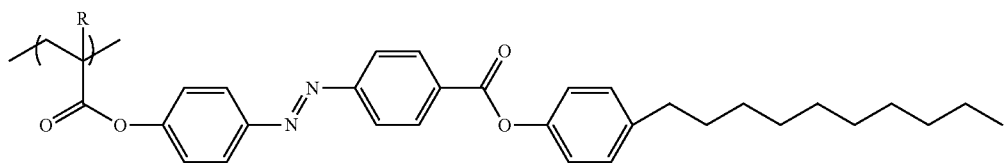
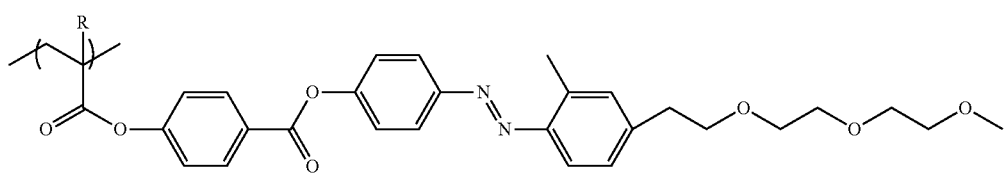
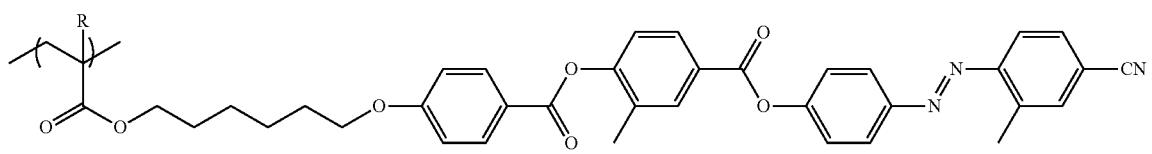
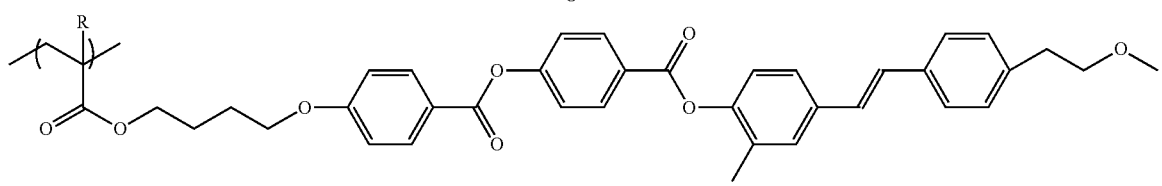
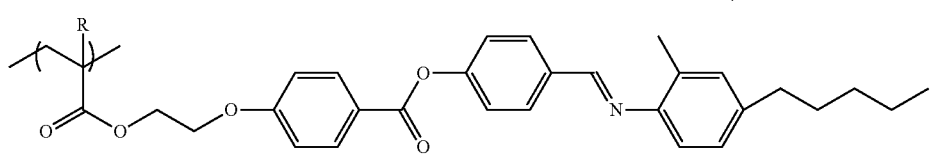
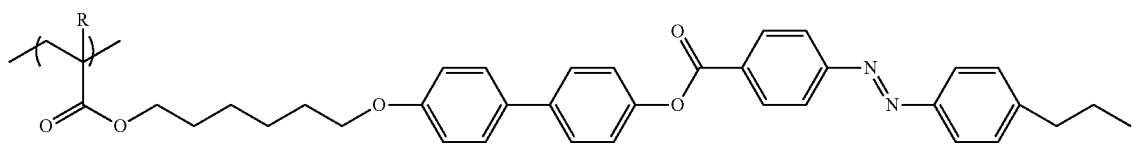
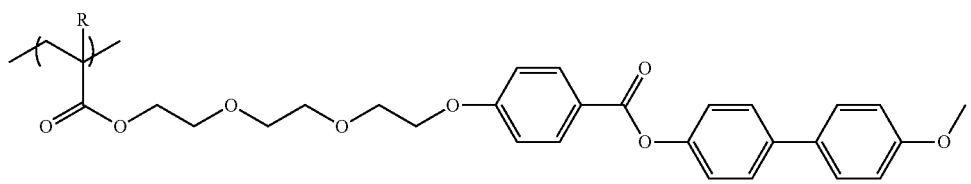
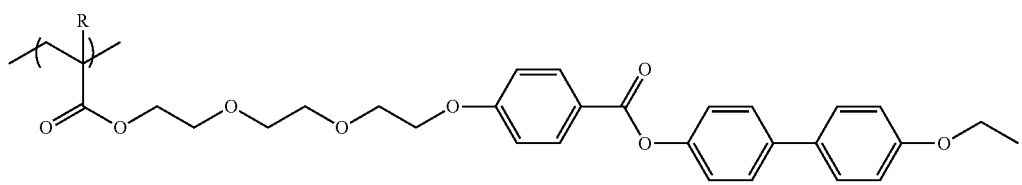
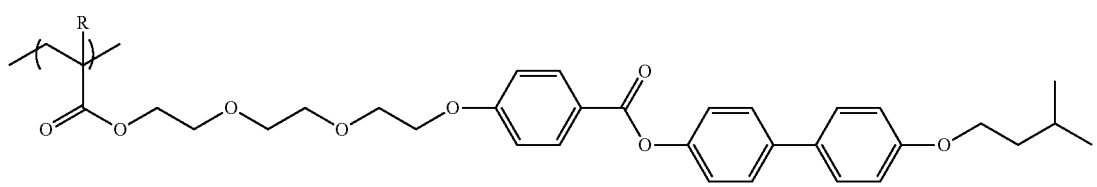

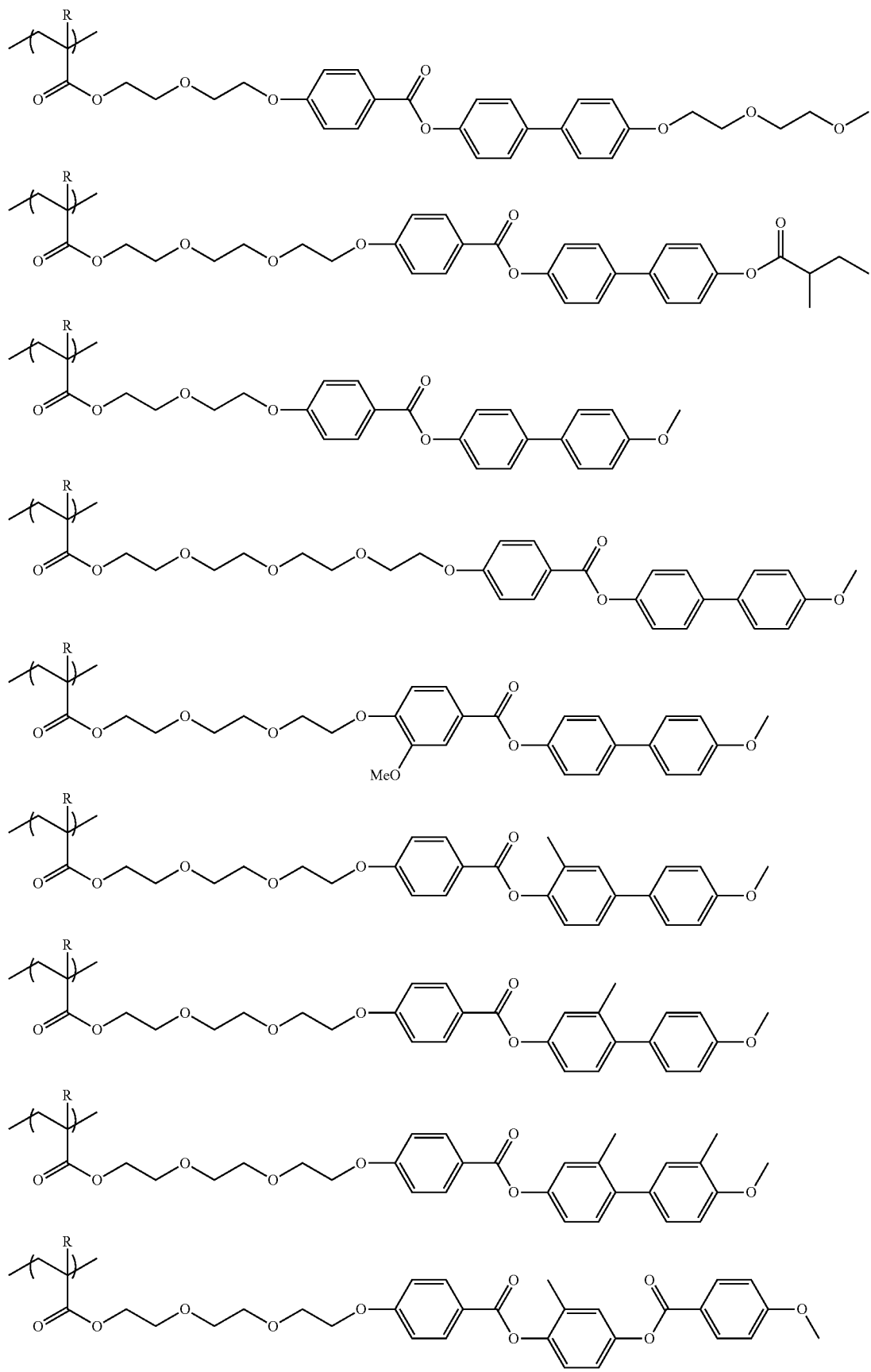

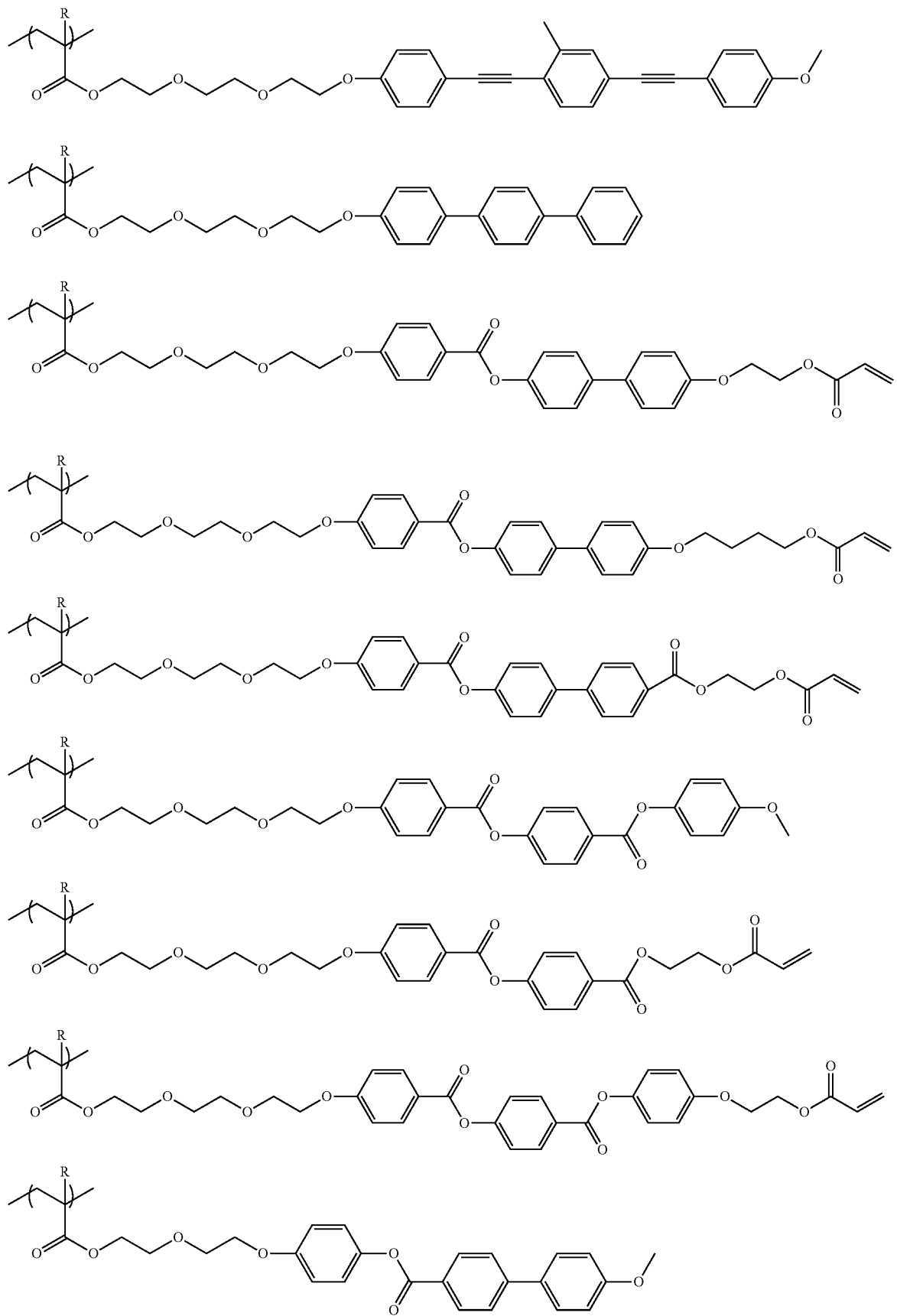

-continued

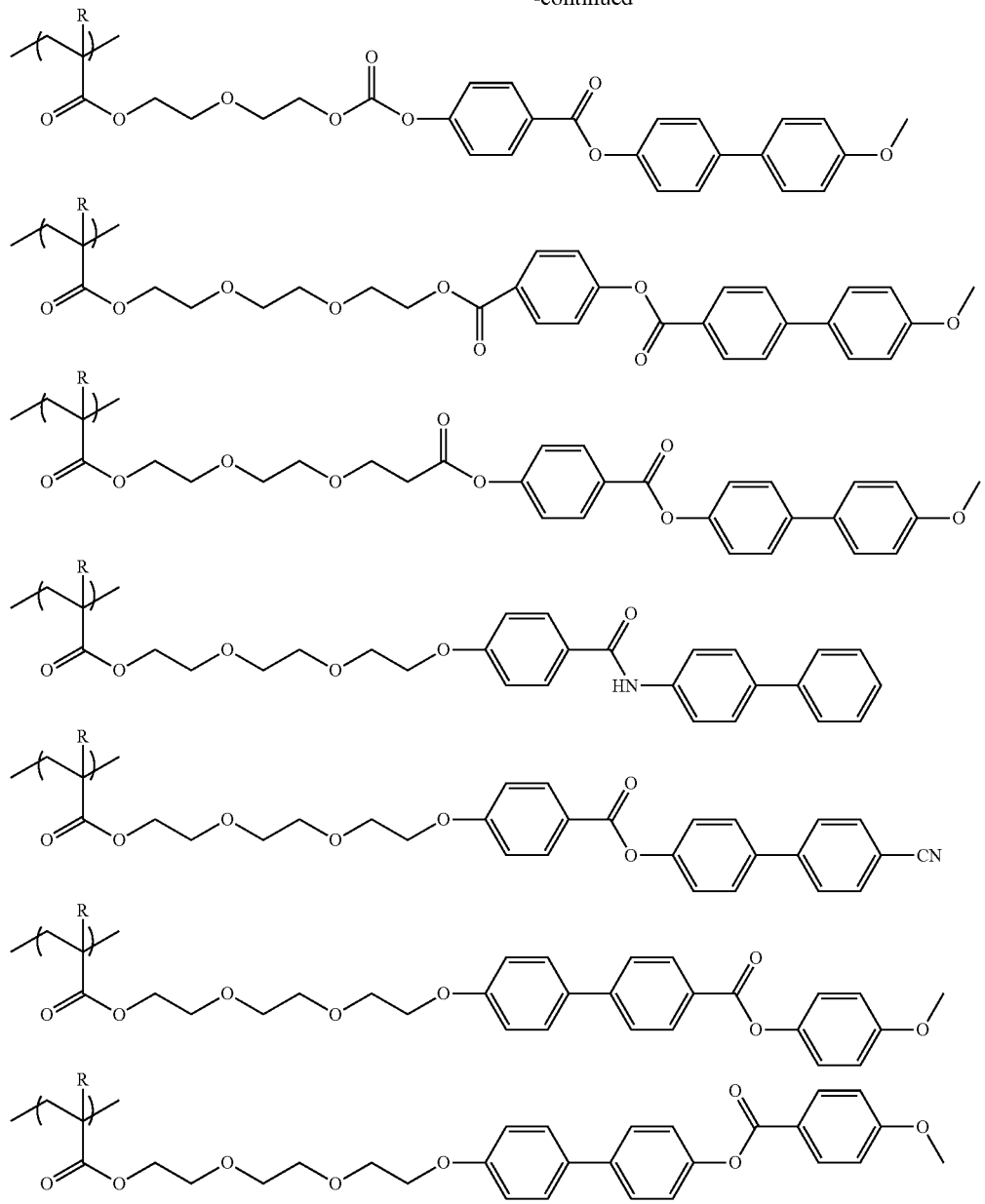

In a case where the polymer liquid crystalline compound has the repeating unit (1), the content of the repeating unit (1) is preferably 20 to 100 mass %, more preferably 30 to 99.9 mass %, and even more preferably 40 to 99.0 mass % with respect to 100 mass % of all the repeating units of the polymer liquid crystalline compound.

In the invention, the content of each repeating unit contained in the polymer liquid crystalline compound is calculated based on the amount (mass) of each monomer used for obtaining each repeating unit.

The polymer liquid crystalline compound may contain only one kind of repeating unit (1) or two or more kinds of repeating units (1). Containing two or more kinds of repeating units (1) in the polymer liquid crystalline compound is advantageous in that the solubility of the polymer liquid crystalline compound in a solvent is improved and the liquid crystal phase transition temperature is easily adjusted. In a case where two or more kinds of repeating units (1) are contained, the total amount thereof is preferably within the above range.

In a case where two or more kinds of repeating units (1) are contained, a repeating unit (1a) in which $T^1$ does not include a polymerizable group and a repeating unit (1b) in which $T^1$ includes a polymerizable group may be used in combination. This further improves the curability of a light absorption anisotropic film.

In this case, in the polymer liquid crystalline compound, a ratio of the repeating unit (1b) in which $T^1$ includes a polymerizable group to the repeating unit (1a) in which $T^1$ does not include a polymerizable group (repeating unit (1b) in which $T^1$ includes polymerizable group/repeating unit (1a) in which $T^1$ does not include polymerizable group) is preferably 0.005 to 4, and more preferably 0.01 to 2.4 in terms of mass ratio. In a case where the mass ratio is 4 or less, there is an advantage in that the alignment degree of a light absorption anisotropic film is further improved. In a case where the mass ratio is 0.05 or greater, the curability of a light absorption anisotropic film is further improved.

In addition, the polymer liquid crystalline compound may have a repeating unit other than the repeating unit (1) (hereinafter, also abbreviated as "repeating unit (2)") from the viewpoint of the solubility of the polymer liquid crystalline compound in a solvent and the adjustment of the liquid crystal phase transition temperature.

Here, examples of the repeating unit (2) include the same repeating unit as the repeating unit (1), except that it has no mesogenic group.

In a case where the polymer liquid crystalline compound has the repeating unit (2), the polymer liquid crystalline compound is a copolymer of the repeating unit (1) and the repeating unit (2), and it may be any one of a block polymer, an alternating polymer, a random polymer, or a graft polymer.

In a case where the polymer liquid crystalline compound contains the repeating unit (2), the content of the repeating unit (2) is preferably 0.5 to 40 mass %, and more preferably 1 to 30 mass % with respect to 100 mass % of all the repeating units of the polymer liquid crystalline compound.

The polymer liquid crystalline compound may contain only one kind of repeating unit (2) or two or more kinds of repeating units (2). In a case where two or more kinds of repeating units (2) are contained, the total amount thereof is preferably within the above range.

<Physical Properties>

A weight-average molecular weight (Mw) of the polymer liquid crystalline compound is preferably 2,000 to 300,000, and more preferably 2,000 to 100,000. In a case where Mw of the polymer liquid crystalline compound is within the above range, handling of the polymer liquid crystalline compound is facilitated.

Here, in the invention, the weight-average molecular weight and the number average molecular weight are values measured by gel permeation chromatography (GPC).

Solvent (eluant): N-methylpyrrolidone
Device Name: TOSOH HLC-8220GPC
Column: Three columns (TOSOH TSKgel Super HZM-H (4.6 mm×15 cm)) are connected and used.
Column Temperature: 25° C.
Sample Concentration: 0.1 mass %
Flow Rate: 0.35 ml/min
Calibration Curve: Using a calibration curve obtained using 7 TSK standard polystyrene samples manufactured by TOSOH Corporation Mw=2,800,000 to 1,050 (Mw/Mn=1.03 to 1.06)

The liquid crystallinity of the polymer liquid crystalline compound may be either nematic or smectic, but is preferably at least nematic.

The temperature range in which a nematic phase is exhibited is preferably room temperature (23° C.) to 400° C., and is preferably 50° C. to 300° C. from the viewpoint of handling and manufacturing suitability.

<Content>

In the invention, the content of the polymer liquid crystalline compound is preferably 8 to 99 mass %, and more preferably 8 to 96 mass % in the solid content of the liquid crystal composition.

Here, the "solid content of the liquid crystal composition" refers to a component excluding the solvent, and specific examples of the solid content include the polymer liquid crystalline compound, a low-molecular-weight liquid crystalline compound to be described later, a dichroic substance, a polymerization initiator, and an interface improver.

(Low-Molecular-Weight Liquid Crystalline Compound)

A liquid crystal composition according to the embodiment of the invention contains a low-molecular-weight liquid crystalline compound.

Here, the "low-molecular-weight liquid crystalline compound" refers to a liquid crystalline compound having no repeating unit in a chemical structure thereof.

Examples of the low-molecular-weight liquid crystalline compound include the liquid crystalline compounds described in JP2013-228706A.

Preferable examples of the low-molecular-weight liquid crystalline compound include liquid crystalline compounds having a structure represented by Formula (2).

$$T^2\text{-}L^1\text{-}M^1\text{-}L^2\text{-}T^1 \quad (2)$$

In Formula (2), $T^1$ and $T^2$ each independently represent a terminal group, $L^1$ and $L^2$ each independently represent a single bond or a divalent linking group, and $M^1$ represents a mesogenic group represented by Formula (2-1).

In Formula (2-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$. In a case where m is an integer of 2 to 10, a plurality of $A^1$'s may be the same or different, and a plurality of $L^3$'s may be the same or different.

Here, examples of the terminal groups represented by $T^1$ and $T^2$ in Formula (2) are similar to those of $T^1$ in Formula (1).

Examples of the divalent linking groups represented by $L^1$ and $L^2$ in Formula (2) are similar to those of $L^1$ and $L^2$ in Formula (1).

Examples of the mesogenic group represented by $M^1$ in Formula (2) are similar to those of the mesogenic group represented by $M^1$ in Formula (1), that is, the mesogenic group represented by Formula (1-1).

<Physical Properties>

The low-molecular-weight liquid crystalline compound has a maximum absorption wavelength of 390 nm or less in a solution.

In a case where the maximum absorption wavelength in a solution is 390 nm or less, the alignment degree of the dichroic substance can be improved without reduction in the alignment degree in a visible region in a case where the low-molecular-weight liquid crystalline compound is blended to improve the alignment degree of the dichroic substance.

Here, to obtain the maximum absorption wavelength, a sample dissolved in chloroform is put into a quartz cell (optical path length: 1 cm), and an absorption spectrum of 240 to 600 nm is measured with a sampling pitch of 1 nm using an ultraviolet visible light spectrophotometer (UV-3100PC, manufactured by SHIMADZU Corporation).

The molecular weight of the low-molecular-weight liquid crystalline compound is preferably less than 1,700, more preferably 200 to 1,500, and even more preferably 200 to less than 1,000.

The liquid crystallinity of the low-molecular-weight liquid crystalline compound is not particularly limited, and examples thereof include a nematic property and a smectic property.

The temperature at which the liquid crystal phase is exhibited is preferably 0° C. to 350° C., more preferably 10° C. to 300° C., and even more preferably 20° C. to 270° C. Particularly, the lower limit temperature (hereinafter, also abbreviated as "melting point" in this specification) at which the liquid crystal phase is exhibited is preferably 200° C. or lower since the alignment degree of the light absorption anisotropic film further increases.

Here, regarding the liquid crystal phase transition temperature in the invention, two polarizing plates are disposed in an optical microscope (ECLIPSE LV100POL manufactured by Nikon Corporation) such that the absorption axes thereof are vertical to each other, a sample placed on a hot plate is disposed between the two polarizing plates, and the temperature of the hot plate is changed during observation using the optical microscope to record a phase transition temperature.

<Content>

In the invention, the content of the low-molecular-weight liquid crystalline compound is preferably 1 to 90 mass %, and more preferably 5 to 80 mass % in the solid content of the liquid crystal composition.

The content of the low-molecular-weight liquid crystalline compound is preferably 3 to 300 parts by mass, and more preferably 5 to 200 parts by mass with respect to 100 parts by mass of the polymer liquid crystalline compound.

[Dichroic Substance]

The dichroic substance contained in the liquid crystal composition according to the embodiment of the invention is not particularly limited, and conventionally known dichroic dyes can be used.

Specific examples thereof include the dichroic dyes described in paragraphs [0067] to [0071] of JP2013-228706A, paragraphs [0008] to [0026] of JP2013-227532A, paragraphs [0008] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0022] to [0080] of JP2015-001425, paragraphs [0005] to [0051] of JP2016-006502, paragraphs [0005] to [0041] of WO2016/060173A, paragraphs [0008] to [0062] of WO2016/136561A, paragraphs [0014] to [0033] of JP2016-044909, paragraphs [0014] to [0033] of JP2016-044910, paragraphs [0013] to [0037] of JP2016-095907, and paragraphs [0014] to [0034] of JP2017-045296.

In the invention, the dichroic substance is preferably a compound having a structure represented by Formula (3) (hereinafter, also referred to as "specific dichroic dye compound") since the alignment degree of a light absorption anisotropic film further increases.

(3)

In Formula (3), $A^2$, $A^3$, and $A^4$ each independently represent a divalent aromatic group which may have a substituent. Any one of $A^2$, $A^3$, or $A^4$ represents a divalent thienothiazole group which may have a substituent.

$L^4$ and $L^5$ each independently represent a substituent.

The "divalent aromatic group which may have a substituent" represented by $A^2$, $A^3$, and $A^4$ in Formula (3) will be described.

Examples of the substituent include the substituent group G described in paragraphs [0237] to [0240] of JP2011-237513A. In the group, a halogen atom, an alkyl group, an alkoxy group, an alkoxycarbonyl group (for example, methoxycarbonyl and ethoxycarbonyl), an aryloxycarbonyl group (for example, phenoxycarbonyl, 4-methylphenoxycarbonyl, and 4-methoxyphenylcarbonyl), and the like are preferable, an alkyl group is more preferable, and an alkyl group having 1 to 5 carbon atoms is even more preferable.

Examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

The divalent aromatic heterocyclic group is preferably a monocyclic or bicyclic heterocyclic ring-derived group. Examples of the atoms other than the carbon atom of the aromatic heterocyclic group include a nitrogen atom, a sulfur atom, and an oxygen atom. In a case where the aromatic heterocyclic group has a plurality of ring-constituting atoms other than the carbon atom, these may be the same or different. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimide-diyl group, and a thienothiazole-diyl group (referred to as "thienothiazole group" in the invention).

Among the divalent aromatic groups, divalent aromatic hydrocarbon groups are preferable.

Here, any one of $A^2$, $A^3$, and $A^4$ is a divalent thienothiazole group which may have a substituent. Specific examples of the substituent of the divalent thienothiazole group are the same as those in the description of the "divalent aromatic group which may have a substituent", and preferable aspects of the substituent are also the same.

$A^3$ of $A^2$, $A^3$, and $A^4$ is preferably a divalent thienothiazole group. In this case, $A^2$ and $A^3$ represent a divalent aromatic group which may have a substituent.

In a case where $A^3$ is a divalent thienothiazole group, it is preferable that at least one of $A^2$ or $A^3$ is a divalent aromatic hydrocarbon group which may have a substituent, and it is more preferable that both $A^2$ and $A^3$ are divalent aromatic hydrocarbon groups which may have a substituent.

The "substituent" represented by $L^4$ and $L^5$ in Formula (3) will be described.

Preferable examples of the substituent include a group having a group introduced to increase the solubility or the nematic liquid crystallinity of an azo compound, an electron-donating group or an electron-withdrawing group introduced to adjust a color tone as a dye, or a crosslinkable group (polymerizable group) introduced to fix the alignment.

Examples of the substituent include an alkyl group (preferably having 1 to 20 carbon atoms, more preferably 1 to 12 carbon atoms, and particularly preferably 1 to 8 carbon atoms, and examples thereof include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably having 2 to 20 carbon atoms, more preferably 2 to 12 carbon atoms, and particularly preferably 2 to 8 carbon atoms, and examples thereof include a vinyl group, an aryl group, a 2-butenyl group, and a 3-pentenyl group), an alkynyl group (preferably having 2 to 20 carbon atoms, more preferably 2 to 12 carbon atoms, and particularly preferably 2 to 8 carbon atoms, and examples thereof include a propargyl group and a 3-pentynyl group), an aryl group (preferably having 6 to 30 carbon atoms, more preferably 6 to 20 carbon atoms, and particularly preferably 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably having 0 to 20 carbon atoms, more preferably 0 to 10 carbon atoms, and particularly preferably 0 to 6 carbon atoms, and examples thereof include an unsubstituted amino group, a methylamino group, a dimethylamino group, a diethylamino group, and an anilino group), an alkoxy group (preferably having 1 to 20 carbon atoms, and more preferably 1 to 15 carbon atoms, and examples thereof include a methoxy group, an ethoxy group, and a butoxy group), an oxycarbonyl group (preferably having 2 to 20 carbon atoms, more preferably 2 to 15 carbon atoms, and particularly preferably 2 to 10 carbon atoms, and examples thereof include a methoxycarbonyl group, an ethoxycarbonyl group, and a phenoxycarbonyl group), an acyloxy group (preferably having 2 to 20 carbon atoms, more preferably 2 to 10 carbon atoms, and particularly preferably 2 to 6 carbon atoms, and examples thereof include an acetoxy group, a benzoyloxy group, an acryloyl group, and a methacryloyl group), an acylamino group (preferably having 2 to 20 carbon atoms, more preferably 2 to 10 carbon atoms, and particularly preferably 2 to 6 carbon atoms, and examples thereof include an acetylamino group and a benzoylamino group), an alkoxycarbonylamino group (preferably having 2 to 20 carbon atoms, more preferably 2 to 10 carbon atoms, and particularly preferably 2 to 6 carbon atoms, and examples thereof include a methoxycarbonylamino group), an aryloxycarbonylamino group (preferably having 7 to 20 carbon atoms, more preferably 7 to 16 carbon atoms, and particularly preferably 7 to 12 carbon atoms, and examples thereof include a phenyloxycarbonylamino group), a sulfonylamino group (preferably having 1 to 20 carbon atoms, more preferably 1 to 10 carbon atoms, and particularly preferably 1 to 6 carbon atoms, and examples thereof include a methanesulfonylamino group and a benzenesulfonylamino group), a sulfamoyl group (preferably having 0 to 20 carbon atoms, more preferably 0 to 10 carbon atoms, and particularly preferably 0 to 6 carbon atoms, and examples thereof include a sulfamoyl group, a methylsulfamoyl group, a dimethylsulfamoyl group, and a phenylsulfamoyl group), a carbamoyl group (preferably having 1 to 20 carbon atoms, more preferably 1 to 10 carbon atoms, and particularly preferably 1 to 6 carbon atoms, and examples thereof include an unsubstituted carbamoyl group, a methylcarbamoyl group, a diethylcarbamoyl group, and a phenylcarbamoyl group), an alkylthio group (preferably having 1 to 20 carbon atoms, more preferably 1 to 10 carbon atoms, and particularly preferably 1 to 6 carbon atoms, and examples thereof include a methylthio group and an ethylthio group), an arylthio group (preferably having 6 to 20 carbon atoms, more preferably having 6 to 16 carbon atoms, and particularly preferably 6 to 12 carbon atoms, and examples thereof include a phenylthio group), a sulfonyl group (preferably having 1 to 20 carbon atoms, more preferably 1 to 10 carbon atoms, and particularly preferably 1 to 6 carbon atoms, and examples thereof include a mesyl group and a tosyl group), a sulfinyl group (preferably having 1 to 20 carbon atoms, more preferably 1 to 10 carbon atoms, and particularly preferably 1 to 6 carbon atoms, and examples thereof include a methanesulfinyl group and a benzenesulfinyl group), a ureido group (preferably having 1 to 20 carbon atoms, more preferably 1 to 10 carbon atoms, and particularly preferably 1 to 6 carbon atoms, and examples thereof include an unsubstituted ureido group, a methylureido group, and a phenylureido group), a phosphoric acid amide group (preferably having 1 to 20 carbon atoms, more preferably 1 to 10 carbon atoms, and particularly preferably 1 to 6 carbon atoms, and examples thereof include a diethylphosphoric acid amide group and a phenylphosphoric acid amide group), a hydroxy group, a mercapto group, a halogen atom (for example, a fluorine atom, a chlorine atom, a bromine atom, and an iodine atom), a cyano group, a nitro group, a hydroxamic group, a sulfino group, a hydrazino group, an imino group, an azo group, a heterocyclic group (preferably having 1 to 30 carbon atoms, and more preferably 1 to 12 carbon atoms, and examples thereof include a heterocyclic group having a hetero atom such as a nitrogen atom, an oxygen atom, and a sulfur atom, such as an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group), and a silyl group (preferably having 3 to 40 carbon atoms, more preferably 3 to 30 carbon atoms, and particularly preferably 3 to 24 carbon atoms, and examples thereof include a trimethylsilyl group and a triphenylsilyl group).

These substituents may be further substituted by the above substituents. In a case where two or more substituents are included, the substituents may be the same or different. They may be optionally bonded to each other to form a ring.

Preferable examples of the substituent represented by $L^4$ and $L^5$ include an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, and a heterocyclic group. An alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, and an azo group are more preferable.

It is preferable that at least one of $L^4$ or $1.5$ contains a crosslinkable group (polymerizable group), and it is more preferable that both $L^4$ and $L^5$ contain a crosslinkable group. Accordingly, a dichroic ratio of a light absorption anisotropic film can be further improved. Moreover, it is possible to accelerate the curing of the dichroic dye compound itself, and thus there is an advantage in that the curability and durability of the light absorption anisotropic film can be improved.

Specific examples of the crosslinkable group include the polymerizable groups described in paragraphs [0040] to [0050] of JP2010-244038A. An acryloyl group, a methacryloyl group, an epoxy group, an oxetanyl group, and a styryl group are preferable, and an acryloyl group and a methacryloyl group are more preferable from the viewpoint of reactivity and synthesis suitability.

Suitable aspects of $L^4$ and $L^5$ include an alkyl group substituted by the crosslinkable group, a dialkylamino group substituted by the crosslinkable group, and an alkoxy group substituted by the crosslinkable group.

The structure represented by Formula (3) is preferably a structure represented by Formula (4) from the viewpoint of an improvement of the dichroic ratio.

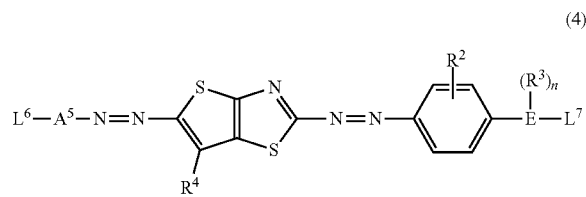

(4)

In Formula (4), $A^5$ represents a divalent aromatic group which may have a substituent.

In Formula (4), $L^6$ and $L^7$ each independently represent a substituent.

In Formula (4), E represents any one of a nitrogen atom, an oxygen atom, or a sulfur atom.

In Formula (4), $R^2$ represents any one of a hydrogen atom, a halogen atom, an alkyl group which may have a substituent, or an alkoxy group which may have a substituent.

In Formula (4), $R^3$ represents a hydrogen atom or an alkyl group which may have a substituent.

In Formula (4), $R^4$ represents a hydrogen atom or a substituent.

In Formula (4), n represents 0 or 1. In a case where E is a nitrogen atom, n is 1, and in a case where E is an oxygen atom or a sulfur atom, n is 0.

Specific examples and suitable aspects of the "divalent aromatic group which may have a substituent" represented by $A^5$ in Formula (4) are similar to those of the "divalent aromatic group which may have a substituent" represented by $A^1$ to $A^3$ in Formula (3).

A phenylene group is a particularly preferable aspect of A.

Specific examples and suitable aspects of the "substituent" represented by $L^6$ and $L^7$ in Formula (4) are similar to those of the "substituent" represented by $L^4$ and $L^5$ in Formula (3).

A more suitable aspect of $L^6$ and $L^7$ is that at least one of $L^6$ or $L^7$ contains a crosslinkable group, and an even more suitable aspect is that both $L^6$ and $L^7$ contain a crosslinkable group. Accordingly, a dichroic ratio of a light absorption anisotropic film can be further improved. Moreover, it is possible to accelerate the curing of the dichroic dye compound itself, and thus there is an advantage in that the curability and durability of the light absorption anisotropic film can be improved.

An acryloyl group or a methacryloyl group is a more suitable aspect of the crosslinkable group of $L^6$ and $L^7$.

In Formula (4), E represents any one of a nitrogen atom, an oxygen atom, or a sulfur atom, and is preferably a nitrogen atom from the viewpoint of synthesis suitability.

E in Formula (1) is preferably an oxygen atom from the viewpoint of making it easy for a specific dichroic dye compound to have an absorption property on the short wavelength side (for example, have a maximum absorption wavelength in the vicinity of 500 to 530 nm).

E in Formula (1) is preferably a nitrogen atom from the viewpoint of making it easy for a specific dichroic dye compound to have an absorption property on the long wavelength side (for example, have a maximum absorption wavelength in the vicinity of 600 nm).

In Formula (4), $R^2$ represents any one of a hydrogen atom, a halogen atom, an alkyl group which may have a substituent, or an alkoxy group which may have a substituent. A hydrogen atom or an alkyl group which may have a substituent is preferable.

Next, the "alkyl group which may have a substituent" and the "alkoxy group which may have a substituent" represented by $R^2$ will be described.

Examples of the substituent include a halogen atom.

Examples of the alkyl group include linear, branched, or cyclic alkyl groups having 1 to 8 carbon atoms. Among these, a linear alkyl group having 1 to 6 carbon atoms is preferable, a linear alkyl group having 1 to 3 carbon atoms is more preferable, and a methyl group or an ethyl group is even more preferable.

Examples of the alkoxy group include alkoxy groups having 1 to 8 carbon atoms. Among these, an alkoxy group having 1 to 6 carbon atoms is preferable, an alkoxy group having 1 to 3 carbon atoms is more preferable, and a methoxy group or an ethoxy group is even more preferable.

In Formula (4), $R^3$ represents a hydrogen atom or an alkyl group which may have a substituent, and an alkyl group which may have a substituent is preferable.

Since specific examples and suitable aspects of the "alkyl group which may have a substituent" represented by $R^3$ are similar to those of the "alkyl group which may have a substituent" represented by $R^2$ in Formula (4), the description thereof will be omitted.

$R^3$ is a group existing in Formula (4) in a case where E is a nitrogen atom (that is, n=1). $R^3$ is a group which does not exist in Formula (4) in a case where E is an oxygen atom or a sulfur atom (that is, n=0).

In Formula (4), $R^4$ represents a hydrogen atom or a substituent.

Since specific examples, suitable aspects, and preferable aspects of the "substituent" represented by $R^4$ are the same as those of the substituent of the "divalent aromatic group which may have a substituent" described above, the description thereof will be omitted.

In Formula (4), n represents 0 or 1. In a case where E is a nitrogen atom, n is 1, and in a case where E is an oxygen atom or a sulfur atom, n is 0.

In the invention, two or more kinds of dichroic substances may be used in combination. For example, from the viewpoint of making a color of the light absorption anisotropic film close to black, at least one kind of dye compound having a maximum absorption wavelength in a wavelength range of 370 to 550 nm, and at least one kind of dye compound having a maximum absorption wavelength in a wavelength range of 500 to 700 nm are preferably used in combination.

In the invention, the dichroic substance preferably has a crosslinkable group since pressing resistance is further improved.

Specific examples of the crosslinkable group include a (meth)acryloyl group, an epoxy group, an oxetanyl group, and a styryl group, and among these, a (meth)acryloyl group is preferable.

<Content>

In the invention, the content of the dichroic substance is preferably 2 to 90 mass %, and more preferably 3 to 80 mass % in the solid content of the liquid crystal composition.

The content of the dichroic substance is preferably 2 to 400 parts by mass, more preferably 3 to 300 parts by mass, and even more preferably 4 to 200 parts by mass with respect to 100 parts by mass of the polymer liquid crystalline compound from the viewpoint of achieving a good balance between the alignment degree and the uniformity of the light absorption anisotropic film.

[Polymerization Initiator]

The liquid crystal composition used in the invention preferably contains a polymerization initiator.

The polymerization initiator is not particularly limited, and a photosensitive compound, that is, a photopolymerization initiator is preferable.

As the photopolymerization initiator, various kinds of compounds can be used with no particular limitation. Examples of the photopolymerization initiator include α-carbonyl compounds (the specifications of U.S. Pat. Nos. 2,367,661A and 2,367,670A), acyloin ethers (the specification of U.S. Pat. No. 2,448,828A), aromatic acyloin compounds substituted by α-hydrocarbon (the specification of U.S. Pat. No. 2,722,512A), polynuclear quinone compounds (the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), and acylphosphine oxide compounds (JP1988-40799B (JP-S63-40799B), JP1993-29234B (JP-H5-29234B), JP1998-95788B (JP-H10-95788B), and JP1998-29997B (JP-H10-29997B)).

A commercially available product can also be used as the photopolymerization initiator, and examples thereof include IRGACURE (hereinafter, also abbreviated as "Irg")-184, IRGACURE-907, IRGACURE-369, IRGACURE-651, IRGACURE-819, IRGACURE-OXE-01, and IRGACURE-OXE-02 manufactured by BASF SE.

In a case where the liquid crystal composition according to the embodiment of the invention contains a polymerization initiator, the content of the polymerization initiator is preferably 0.1 to 30 parts by mass, more preferably 0.3 to 30 parts by mass, and even more preferably 0.5 to 20 parts by mass with respect to a total of 100 parts by mass of the dichroic substance, the polymer liquid crystalline compound, and the low-molecular-weight liquid crystalline compound in the liquid crystal composition. In a case where the content of the polymerization initiator is 0.1 parts by mass or greater, the durability of a light absorption anisotropic film is improved, and in a case where the content of the polymerization initiator is 30 parts by mass or less, the alignment degree of a light absorption anisotropic film is improved.

[Solvent]

From the viewpoint of workability and the like, the liquid crystal composition according to the embodiment of the invention preferably contains a solvent.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyltetrahydrofuran, cyclopentyl methyl ether, tetrahydropyran, and dioxolan), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane, dichloroethane, dichlorobenzene, and chlorotoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethyl sulfoxide), amides (for example, dimethylformamide, dimethylacetamide, N-methylpyrrolidone, and N-ethylpyrrolidone), and heterocyclic compounds (for example, pyridine), and water. These solvents may be used alone or in combination of two or more kinds thereof.

Among these solvents, ketones (particularly, cyclopentanone and cyclohexanone), ethers (particularly, tetrahydrofuran, cyclopentyl methyl ether, tetrahydropyran, and dioxolan) and amides (particularly, dimethylformamide, dimethylacetamide, N-methylpyrrolidone, and N-ethylpyrrolidone) are preferable from the viewpoint of utilizing the effect of the invention that the solubility is excellent.

In a case where the liquid crystal composition according to the embodiment of the invention contains a solvent, the content of the solvent is preferably 80 to 99 mass %, more preferably 83 to 98 mass %, and even more preferably 85 to 96 mass % with respect to the total mass of the liquid crystal composition.

[Interface Improver]

The liquid crystal composition according to the embodiment of the invention preferably contains an interface improver. Due to the interface improver contained, the smoothness of the coating surface is improved, and the alignment degree is improved or cissing and unevenness are suppressed. Thus, an improvement in the in-plane uniformity is anticipated.

As the interface improver, a material making the polymer liquid crystalline compound horizontal on the coating surface side is preferable, and the compounds (horizontal alignment agents) described in paragraphs [0253] to [0293] of JP2011-237513A can be used.

In a case where the liquid crystal composition according to the embodiment of the invention contains an interface improver, the content of the interface improver is preferably 0.001 to 5 parts by mass, and more preferably 0.01 to 3 parts by mass with respect to a total of 100 parts by mass of the dichroic substance and the polymer liquid crystalline compound in the liquid crystal composition.

[Light Absorption Anisotropic Film]

A light absorption anisotropic film according to the embodiment of the invention is formed using the above-described liquid crystal composition according to the embodiment of the invention.

Examples of the method of manufacturing the light absorption anisotropic film according to the embodiment of the invention include a method including, in order, a step of forming a coating film by applying the liquid crystal composition to a base (hereinafter, also referred to as "coating film forming step") and a step of aligning a dichroic substance contained in the coating film (hereinafter, also referred to as "alignment step").

Hereinafter, the respective steps of the method of manufacturing the light absorption anisotropic film according to the embodiment of the invention will be described.

[Coating Film Forming Step]

The coating film forming step is a step of forming a coating film by applying the liquid crystal composition to a base.

By using a liquid crystal composition containing the above-described solvent, or a liquid material such as a molten liquid obtained by heating the liquid crystal composition, the liquid crystal composition is easily applied to the base.

Examples of the method of applying the liquid crystal composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

In this aspect, an example has been given in which the liquid crystal composition is applied to the base, but the invention is not limited thereto. For example, the liquid crystal composition may be applied to an alignment film provided on the base. Details of the base and the alignment film will be described later.

[Alignment Step]

The alignment step is a step of aligning a dichroic substance contained in the coating film. Thus, a light absorption anisotropic film is obtained.

The alignment step may have a drying treatment. Through the drying treatment, a component such as a solvent can be removed from the coating film. The drying treatment may be performed by a method of leaving the coating film for a predetermined time at room temperature (for example, natural drying), or a heating and/or air blowing method.

Here, the dichroic substance contained in the liquid crystal composition may be aligned by the above-described coating film forming step or drying treatment. For example, in an aspect in which the liquid crystal composition is prepared as a coating liquid containing a solvent, the coating film is dried to remove the solvent from the coating film, and thus a coating film having light absorption anisotropy (that is, light absorption anisotropic film) is obtained.

The alignment step preferably has a heating treatment. Accordingly, the dichroic substance contained in the coating film can be aligned, and thus the coating film after the heating treatment can be preferably used as a light absorption anisotropic film.

The heating treatment is preferably performed at 10° C. to 250° C., and more preferably at 25° C. to 190° C. in view of manufacturing suitability or the like. The heating time is preferably 1 to 300 seconds, and more preferably 1 to 60 seconds.

The alignment step may have a cooling treatment to be performed after the heating treatment. The cooling treatment is a treatment for cooling the coating film after the heating to about room temperature (20° C. to 25° C.). Accordingly, the alignment of the dichroic substance contained in the coating film can be fixed. The cooling means is not particularly limited, and the cooling can be performed by a known method.

By the above steps, a light absorption anisotropic film can be obtained.

In this aspect, examples of the method of aligning the dichroic substance contained in the coating film include the drying treatment and the heating treatment, but are not limited thereto, and a known alignment treatment can be used.

[Other Steps]

The method of manufacturing a light absorption anisotropic film may have a step of curing the light absorption anisotropic film (hereinafter, also referred to as "curing step") after the alignment step.

For example, the curing step is performed by heating and/or light irradiation (exposure). Among these, light irradiation is preferably performed to conduct the curing step.

As the light source used for curing, various light sources can be used such as infrared rays, visible light, and ultraviolet rays, and ultraviolet rays are preferable. In the curing, ultraviolet rays may be applied during heating, or may be applied via a filter which transmits only a component with a specific wavelength.

In addition, the exposure may be performed under a nitrogen atmosphere. In a case where the light absorption anisotropic film is cured by radical polymerization, inhibition of the polymerization by oxygen is reduced, and thus the exposure is preferably performed under a nitrogen atmosphere.

The film thickness of the light absorption anisotropic film is preferably 0.1 to 5.0 μm, and more preferably 0.3 to 1.5 μm. Although depending on the concentration of the dichroic substance in the liquid crystal composition, a light absorption anisotropic film having an excellent absorbance is obtained in a case where the film thickness is 0.1 μm or greater, and a light absorption anisotropic film having an excellent transmittance is obtained in a case where the film thickness is 5.0 μm or less.

[Laminate]

A laminate according to the embodiment of the invention has a base and the light absorption anisotropic film according to the embodiment of the invention formed on the base.

The laminate according to the embodiment of the invention may further have a λ/4 plate formed on the light absorption anisotropic film.

In addition, the laminate according to the embodiment of the invention may have an alignment film between the base and the light absorption anisotropic film.

Hereinafter, the constituent layers of the laminate according to the embodiment of the invention will be described.

[Base]

The base can be selected in accordance with usage of the light absorption anisotropic film, and examples thereof include glass and a polymer film. The light transmittance of the base is preferably 80% or greater.

In a case where a polymer film is used as the base, an optically isotropic polymer film is preferably used. As specific examples and preferable aspects of the polymer, those described in a paragraph [0013] of JP2002-022942A can be applied. In addition, even a conventionally known polymer such as polycarbonate or polysulfone in which birefringence is likely to be developed can also be used by reducing the developability through molecular modification described in WO02000/026705A.

[Light Absorption Anisotropic Film]

Since the light absorption anisotropic film is as described above, the description thereof will be omitted.

[λ/4 Plate]

The "λ/4 plate" is a plate having a λ/4 function, and is specifically, a plate having a function of converting linearly polarized light with a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In an aspect in which the λ/4 plate has a multilayered structure, specific examples of the plate include a broadband λ/4 plate having a laminate of a λ/4 plate and λ/2 plate.

The λ/4 plate and the light absorption anisotropic film may be provided in contact with each other, or another layer may be provided between the λ/4 plate and the light absorption anisotropic film. Examples of the layer include a pressure sensitive adhesive layer or an adhesive layer for securing adhesiveness.

[Alignment Film]

The laminate according to the embodiment of the invention may have an alignment film between the base and the light absorption anisotropic film.

As the alignment film, any layer may be used as long as it allows the dichroic substance contained in the liquid crystal composition according to the embodiment of the invention to have a desired alignment state on the alignment film.

The alignment film can be provided by means of a rubbing treatment on the film surface with an organic compound (preferably a polymer), oblique vapor deposition of an inorganic compound, forming a layer having microgrooves, or accumulation of an organic compound (for example, co-tricosanoic acid, dioctadecylmethylammonium chloride or methyl stearate) by the Langmuir-Blodgett method (LB film). Furthermore, there have been known alignment films having an aligning function imparted thereto by applying an electrical field, applying a magnetic field, or light irradiation. In the invention, among these, an alignment film formed by a rubbing treatment is preferable in view of easy control of a pretilt angle of the alignment film, and a photo-alignment film formed by light irradiation is also preferable in view of alignment uniformity.

<Rubbed Alignment Film>

The polymer material used for an alignment film formed by a rubbing treatment is described in many literatures, and many commercially available products are available. In the invention, polyvinyl alcohol or polyimide, or derivatives thereof can be preferably used. Regarding the alignment film, the description in the 24th line on page 43 to 8th line on page 49 in WO2001/088574A1 can be referred to. The thickness of the alignment film is preferably 0.01 to 10 μm, and more preferably 0.01 to 1 μm.

<Photo-Alignment Film>

The photo-alignment material used for an alignment film formed by light irradiation is described in many literatures. In the invention, preferable examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, and esters are more preferable.

To a photo-alignment film formed from the above-described material, linearly polarized light or unpolarized light is applied to manufacture a photo-alignment film.

In this specification, the "linearly polarized light irradiation" and the "unpolarized light irradiation" are operations for causing a photoreaction to the photo-alignment material. The wavelength of the light used varies depending on the photo-alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon are lamp, various lasers [for example, a semiconductor laser, a helium/neon laser, an argon ion laser, a helium/cadmium laser, and an YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or oblique to the alignment film surface is employed. Although the incidence angle of the light varies depending on the photo-alignment material, the incidence angle is preferably 00 to 90° (vertical), and more preferably 40° to 90°.

In a case where unpolarized light is used, the alignment film is irradiated with unpolarized light from an oblique direction. The incidence angle of the light is preferably 10° to 800, and more preferably 20° to 60°, and even more preferably 30° to 500.

The irradiation time is preferably 1 minute to 60 minutes, and more preferably 1 minute to 10 minutes.

In a case where patterning is required, a method of performing light irradiation using a photomask as many times as necessary for pattern formation, or a pattern writing method using laser beam scanning can be employed.

[Usage]

The laminate according to the embodiment of the invention can be used as a polarizing element (polarizing plate). For example, it can be used as a linearly polarizing plate or a circularly polarizing plate.

In a case where the laminate according to the embodiment of the invention has no optically anisotropic layer such as the λ/4 plate, the laminate can be used as a linearly polarizing plate.

In a case where the laminate according to the embodiment of the invention has the λ/4 plate, the laminate can be used as a circularly polarizing plate.

[Image Display Device]

An image display device according to the embodiment of the invention has the above-described light absorption anisotropic film or the above-described laminate.

The display element used for the image display device according to the embodiment of the invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the embodiment of the invention preferably has an aspect in which it has the above-described light absorption anisotropic film and a liquid crystal cell. More preferably, the liquid crystal display device has the above-described laminate (but including no λ/4 plate) and a liquid crystal cell.

In the invention, it is preferable that the light absorption anisotropic film (laminate) according to the embodiment of the invention be used as a polarizing element on the front side among light absorption anisotropic films (laminates) to be provided on both sides of a liquid crystal cell, and it is more preferable that the light absorption anisotropic film (laminate) according to the embodiment of the invention be used as polarizing elements on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, with no application of a voltage, rod-like liquid crystalline molecules are substantially horizontally aligned, and twist-aligned by 60° to 1200. The TN mode liquid crystal cell is most frequently used as a color thin film transistor (TFT) liquid crystal display device, and is described in many literatures.

In a VA mode liquid crystal cell, rod-like liquid crystalline molecules are substantially vertically aligned with no application of a voltage. The VA mode liquid crystal cell includes (1) a narrowly-defined VA mode liquid crystal cell in which rod-like liquid crystalline molecules are substantially vertically aligned with no application of a voltage, and are substantially horizontally aligned with the application of a voltage (described in JP1990-176625A (JP-H2-176625A)), (2) a (MVA mode) liquid crystal cell in which the VA mode is made into multi-domains in order to expand the viewing angle (described in SID97, Digest of tech. Papers (proceedings) 28 (1997) 845), (3) an (n-ASM mode) liquid crystal cell in which rod-like liquid crystalline molecules are substantially vertically aligned with no application of a voltage, and are twisted in multi-domains with the application of a voltage (described in the proceedings 58 and 59 of Japanese Liquid Crystal Conference (1998)), and (4) a SURVIVAL mode liquid crystal cell (announced at LCD internal 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystal molecules are aligned substantially parallel to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. A method of improving the viewing angle by reducing light leakage caused when a black image is displayed in an oblique direction using an optical compensation sheet is disclosed by JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the embodiment of the invention preferably has an aspect in which it has a light absorption anisotropic film, a λ/4 plate, and an organic EL display panel in this order from the visual recognition side.

More preferably, the organic EL display device has the above-described laminate having λ/4 plate and an organic EL display panel in this order from the visual recognition side. In this case, the laminate has a base, an alignment film to be provided as necessary, a light absorption anisotropic film, and λ/4 plate disposed in this order from the visual recognition side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the invention will be more specifically described based on examples. Materials, used amounts, ratios, treatment contents, treatment procedures, and the like shown in the following examples are able to be properly changed as long as not departing from the gist of the invention. Therefore, the scope of the invention will not be restrictively interpreted by the following examples.

Synthesis Example 1

Synthesis of Polymer Liquid Crystalline Compound P1

A polymer liquid crystalline compound P1 was synthesized according to the following steps 1 to 3.

<Step 1>

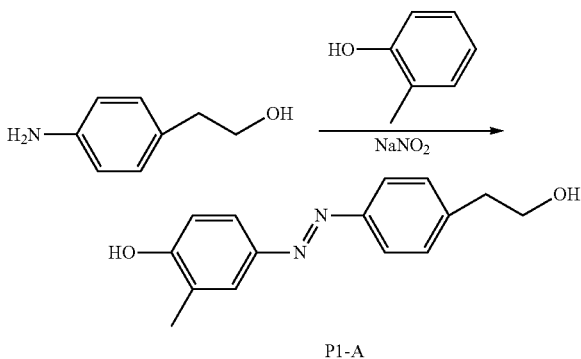

P1-A 20 g of 4-(2-hydroxyethyl)aniline was dissolved in 37 mL of a concentrated hydrochloric acid and 300 mL of water, and the mixture was stirred for 30 minutes at an external temperature of 0° C. While the internal temperature was maintained at 10° C. or lower at an external temperature of 0° C., a solution prepared by dissolving 10.4 g of sodium nitrite in 80 mL of water was added dropwise. The mixture was stirred for 20 minutes at an internal temperature of 10° C. or lower to prepare a diazonium solution.

18.6 g of sodium hydroxide was dissolved in 500 mL of water, and 16.2 g of o-methylphenol was added dropwise thereto. The mixture was stirred for 10 minutes at an external temperature of 0° C. to prepare a coupler solution.

Next, the diazonium solution prepared as described above was added dropwise to the prepared coupler solution while the internal temperature was maintained at 10° C. or lower. The mixture was stirred for 1 hour at room temperature after completion of the dropwise addition.

Next, the mixture was neutralized using a dilute hydrochloric acid solution until the pH became 8 to 9, and a solid was precipitated. The precipitated solid was separated by filtration, washed with water, and dried at 40° C. to obtain 35 g of a yellow solid P1-A.

<Step 2>

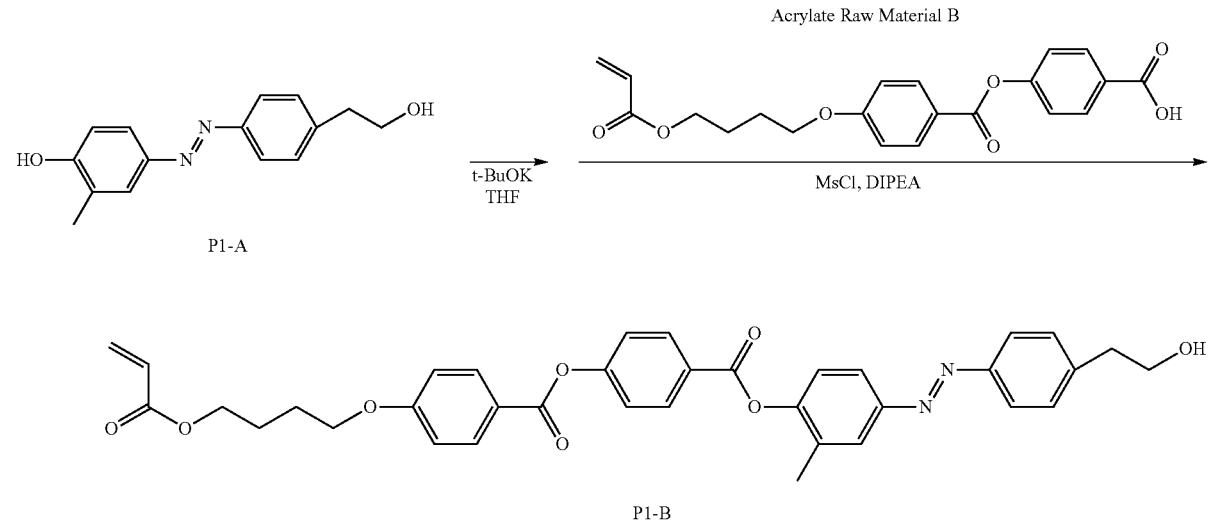

35 g of an acrylate raw material B was dissolved in 400 mL of tetrahydrofuran (THF), and 10.66 g of methanesulfonyl chloride was added thereto. The mixture was stirred for 5 minutes at an external temperature of 0° C. While the internal temperature was maintained at 10° C. or lower, 12.03 g of diisopropylethylamine was added dropwise. The mixture was stirred for 30 minutes at an internal temperature of 10° C. or lower to prepare an acrylate raw material solution.

Next, 11.36 g of t-butoxypotassium and 200 mL of THF were stirred at an external temperature of 0° C. While the internal temperature was maintained at 10° C. or lower, a solution prepared by dissolving 19.88 g of the yellow solid P1-A in 200 mL of THF was added dropwise. The reaction liquid was stirred for 1 hour at room temperature, and then 100 mL of methanol and 1,000 mL of water were added for crystallization. The obtained solid was dissolved in 500 mL of ethyl acetate at an external temperature of 80° C. 550 mL of n-hexane was added thereto, and the temperature was lowered to room temperature to precipitate a solid. The obtained solid was washed with n-hexane and dried at room temperature to obtain 32 g of a yellow solid P1-B.

<Step 3>

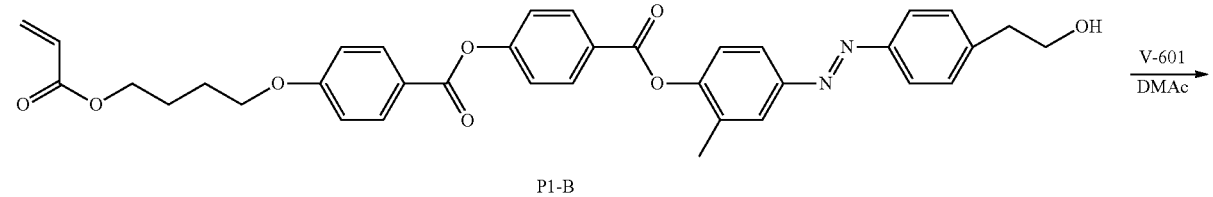

-continued

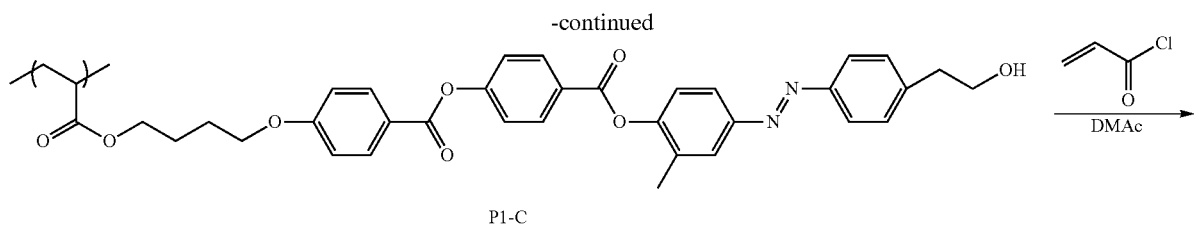

P1-C

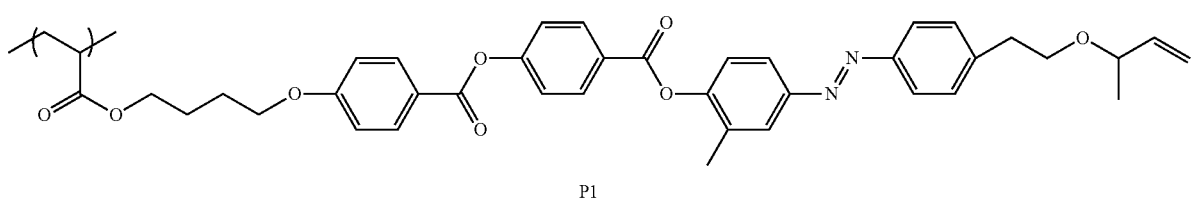

P1

31.13 g of the yellow solid P1-B was dissolved in 125 mL of dimethylacetamide and stirred for 1 hour with flowing nitrogen. The mixture was heated at an external temperature of 90° C., 10 mL of a dimethylacetamide solution with 0.52 g of a polymerization initiator V-601 being dissolved therein was added to the mixture, and the mixture was heated for 2 hours. The addition of the polymerization initiator and the heating for 2 hours at an external temperature of 90° C. were repeated twice to polymerize a yellow solid P1-B. The reaction liquid was heated for 2 hours at 100° C. after completion of the reaction. Thereafter, the internal temperature was lowered to 60° C., and 125 mL of dimethylacetamide was added.

Next, the reaction liquid was cooled at an external temperature of 0° C. 0.2 g of 2,6-di-t-butyl-4-methylphenol was added, and 45.6 g of acrylic acid chloride was added dropwise at an internal temperature maintained at 15° C. or lower. 500 mL of ethyl acetate was added after a reaction for 2 hours at room temperature. The mixture was added dropwise to 2,000 mL of methanol to precipitate a polymer solid. The polymer solid separated by filtration was washed with methanol and dried at room temperature to obtain 31.6 g of a polymer liquid crystal compound P1 as a yellow solid. The obtained polymer liquid crystalline compound P1 was analyzed by gel permeation chromatography (GPC). A number average molecular weight (Mn) was 9,000, and a weight-average molecular weight (Mw) was 19,000 (all in terms of polystyrene).

Synthesis Example 2

Synthesis of Polymer Liquid Crystalline Compound P2

A polymer liquid crystalline compound P2 was synthesized according to the following steps 1 to 3.
<Step 1>

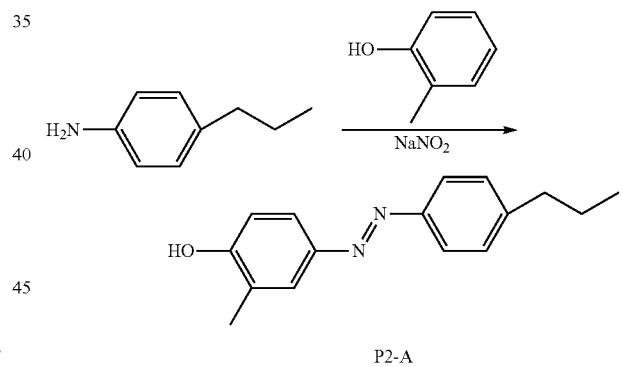

P2-A

A yellow solid P2-A was synthesized in the same manner as in the synthesis of the yellow solid P1-A, except that the 4-(2-hydroxyethyl)aniline as a raw material was changed to 4-propylaniline.
<Step 2>

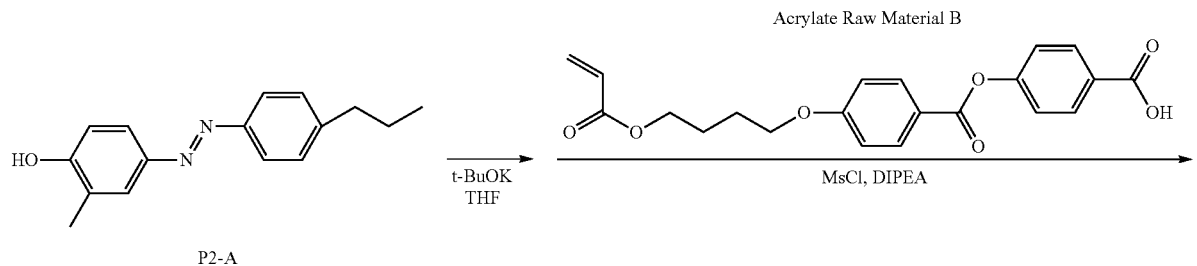

P2-A

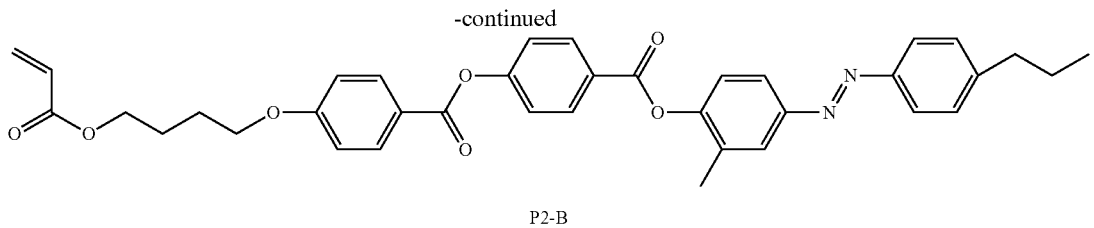

P2-B

A yellow solid P2-B was synthesized in the same manner as in the synthesis of the yellow solid P1-B, except that the yellow solid P1-A as a raw material was changed to the yellow solid P2-A.

<Step 3>

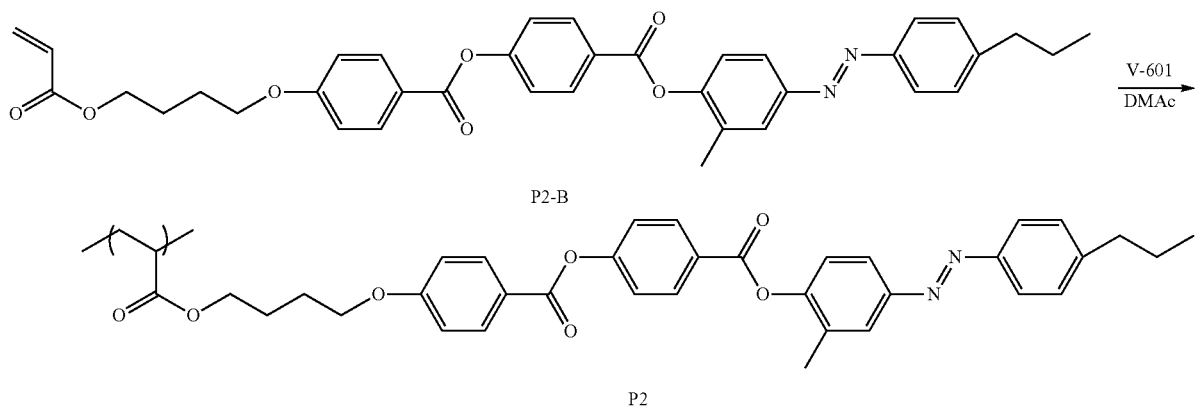

30 g of the yellow solid P2-B was dissolved in 120 mL of dimethylacetamide and stirred for 1 hour with flowing nitrogen. The mixture was heated at an external temperature of 90° C., 10 mL of a dimethylacetamide solution with 0.60 g of a polymerization initiator V-601 being dissolved therein was added to the mixture, and the mixture was heated for 2 hours. The addition of the polymerization initiator and the heating for 2 hours at an external temperature of 90° C. were repeated twice to polymerize a yellow solid P2-B. The reaction liquid was heated for 2 hours at 100° C. after completion of the reaction. Thereafter, the internal temperature was lowered to 60° C., and 150 mL of ethyl acetate was added. The mixture was added dropwise to 2,000 mL of methanol to precipitate a polymer solid. The polymer solid separated by filtration was washed with methanol and dried at room temperature to obtain 29 g of a polymer liquid crystalline compound P2 as a yellow solid. The obtained polymer liquid crystalline compound P2 was analyzed by gel permeation chromatography (GPC). A number average molecular weight (Mn) was 6,600, and a weight-average molecular weight (Mw) was 14,000 (all in terms of polystyrene).

Synthesis Example 3

Synthesis of Polymer Liquid Crystalline Compound P3

A polymer liquid crystalline compound P3 was synthesized according to the following steps 1 to 3.

<Step 1>

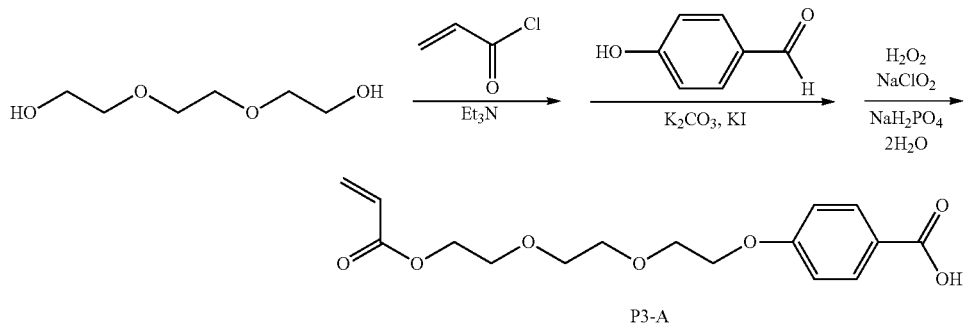

P3-A

Dibutylhydroxytoluene (BHT) (100 mg) was added to a dimethylacetamide (DMAc) solution (60 mL) of 2-chloroethoxyethoxyethanol (14.05 g), and acrylic acid chloride (7.54 g) and triethylamine (8.89 g) were added dropwise under ice cooling. After stirring for 1 hour, the reaction liquid was filtered. Next, potassium carbonate (15.7 g), potassium iodide (0.57 g), p-hydroxybenzaldehyde (9.25 g), and dibutylhydroxytoluene (BHT) (100 mg) were added. After stirring at 110° C. for 4 hours, ethyl acetate and water were added to wash the reaction liquid by a liquid separating operation. The reaction liquid was concentrated by an evaporator. Then, the temperature was returned to room temperature, and 25 mL of acetonitrile, a phosphate buffer obtained by dissolving 2.36 g of sodium dihydrogen phosphate dihydrate in 8 mL of water, and 11.2 mL of hydrogen peroxide water (30 mass %) were added. Next, 33.4 g of a 25 mass % aqueous sodium chlorite solution was added. After stirring for 6 hours at room temperature and leaving for 8 hours, water was added, and the obtained precipitates were collected to obtain 16.9 g of a compound P3-A (yield: 69%) as a white solid.

<Step 2>

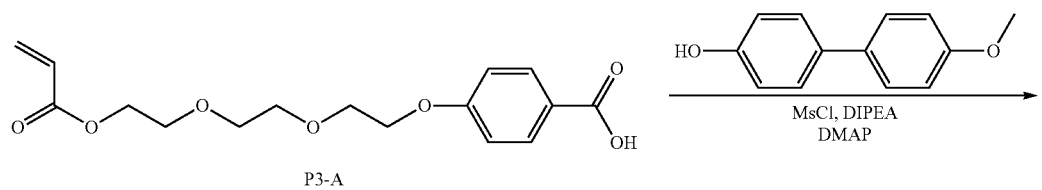

P3-A

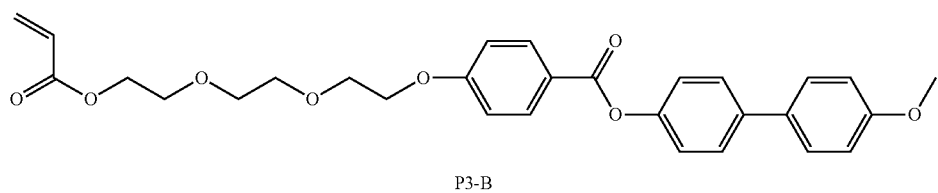

P3-B

Dibutylhydroxytoluene (BHT) (200 mg) was added to a tetrahydrofuran (THF) solution (70 mL) of methanesulfonyl chloride (MsCl) (73.4 mmol, 5.7 mL) and cooled to an internal temperature of −5° C. The compound P3-A (66.7 mmol, 21.6 g) and a THF solution of diisopropylethylamine (DIPEA) (75.6 mmol, 13.0 mL) were added dropwise thereto such that the internal temperature did not increase to 0° C. or higher. After stirring for 30 minutes at −5° C., N,N-dimethyl-4-aminopyridine (DMAP) (200 mg) was added, and diisopropylethylamine (75.6 mmol, 13.0 mL), tetrahydrofuran (THF) of 4-hydroxy-4'-methoxybiphenyl (60.6 mmol, 12.1 g), and a dimethylacetamide (DMAc) solution were added dropwise such that the internal temperature did not increase to 0° C. or higher. Then, stirring was performed for 4 hours at room temperature. The reaction was stopped by adding methanol (5 mL), and then water and ethyl acetate were added. The solvent was removed from the organic layer extracted with the ethyl acetate by a rotary evaporator, and purification by column chromatography using ethyl acetate and hexane was performed to obtain 18.7 g of a compound P3-B1 (yield: 61%) as a white solid.

$^1$H-NMR (Nuclear Magnetic Resonance) (solvent: $CDCl_3$) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (dd, 1H), 6.90-7.05 (m, 4H), 7.20-7.30 (m, 2H), 7.45-7.65 (m, 4H), 8.10-8.20 (m, 2H)

<Step 3>

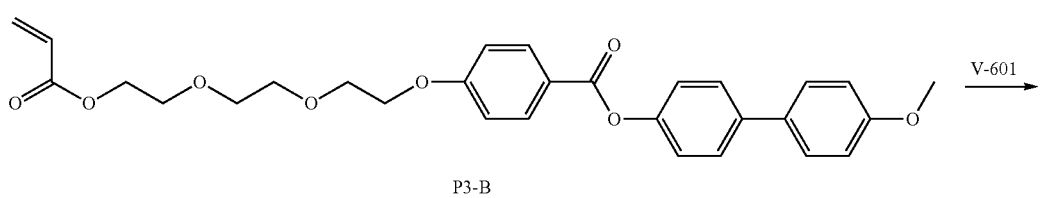

P3-B

-continued

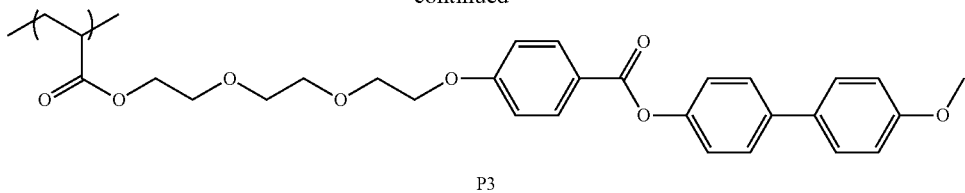

P3

Synthesis Example 4

Synthesis of Polymer Liquid Crystalline Compound P4

A DMAc solution (3.3 mL) of the compound (P3-B) (1.0 g) was heated to an internal temperature of 80° C. A DMAc solution (0.5 mL) of 2,2'-azobis(2-methylpropionic acid) dimethyl (0.54 mmol, 0.12 g) (trade name "V-601", manufactured by FUJIFILM Wako Pure Chemical Corporation) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.95 g of a polymer liquid crystalline compound P3 as a white solid. The obtained polymer liquid crystalline compound P3 was analyzed by gel permeation chromatography (GPC). A weight-average molecular weight (Mw) was 10,000 (in terms of polystyrene).

A polymer liquid crystalline compound P4 was synthesized according to the following steps 1 to 3.

<Step 1>

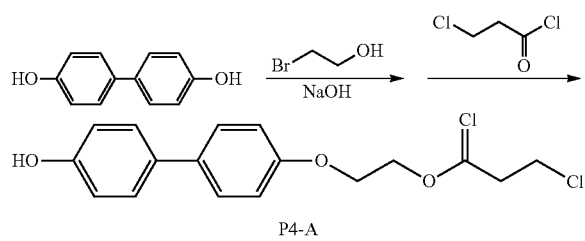

P4-A

Sodium hydroxide (34.2 g) was dissolved in 1 L of water, and 4,4'-dihydroxybiphenyl (40.6 g) and bromoethanol (37.2 g) were added under a nitrogen atmosphere. The mixture was stirred for 10 hours at 95° C.

Then, the reaction system was cooled to room temperature and adjusted to be acidic by adding a concentrated hydrochloric acid. After that, filtering and drying were performed to obtain a white solid containing a compound P4-A.

The obtained white solid was dissolved in 400 mL of dimethylacetamide (DMAc), and 3-chloropropionyl chloride (62.0 g) was added dropwise under ice cooling. Stirring was performed for 5 hours. The reaction was stopped by adding methanol (40 mL), and then water and ethyl acetate were added.

The solvent was removed from the organic layer washed by a liquid separating operation by a rotary evaporator, and chloroform was added to the obtained concentrate. After the precipitated solid was removed by filtering, the solvent was removed by a rotary evaporator, and purification was performed by column chromatography using ethyl acetate/chloroform to obtain 20.3 g of a compound P4-A (yield: 29%) as a white solid.

$^1$H-NMR (solvent: DMSO-$d_6$) δ (ppm): 2.80-2.90 (t, 2H), 3.75-3.85 (t, 2H), 4.15-4.25 (m, 2H), 4.35-4.45 (m, 2H), 6.75-6.85 (m, 2H), 6.90-7.00 (m, 2H), 7.30-7.50 (m, 4H), 9.40 (br·s, 1H)

<Step 2>

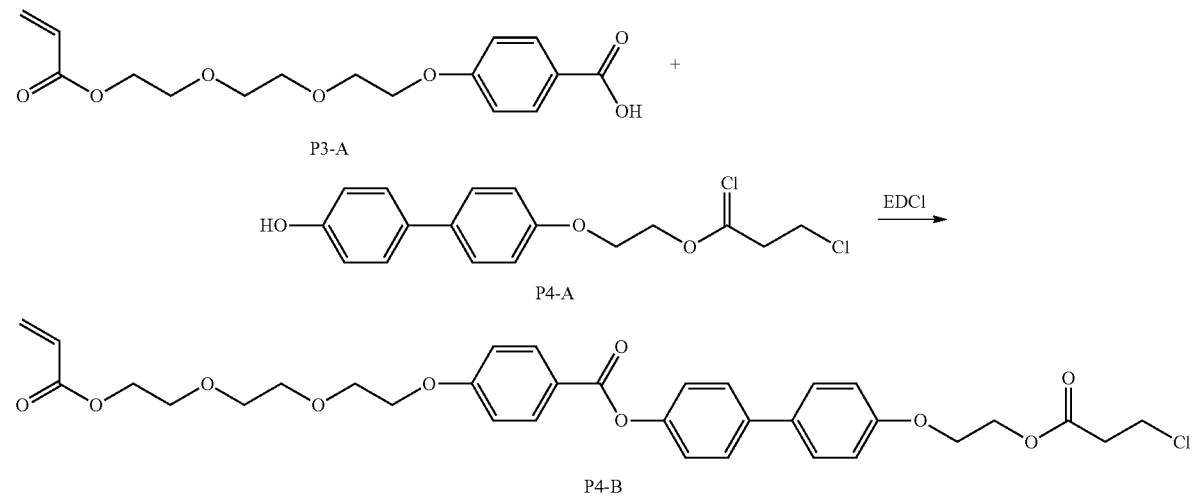

4.0 g of the compound P4-A, 8.08 g of the compound P3-A prepared in Synthesis Example 3, and 100 mL of dichloromethane were mixed and stirred at room temperature. To the mixture, 152 mg of N,N-dimethylaminopyridine and 9.56 g of 1-(3-dimethylaminopropyl)-3-ethylcarbodiimide hydrochloride (EDCl) were added and stirred for 12 hours at room temperature.

Thereafter, the solvent was removed by a rotary evaporator, and filtering was performed by adding 120 mL of methanol and 120 mL of a 1 M hydrochloric acid solution to obtain a white solid. Ethyl acetate and water were added to the obtained white solid, and liquid separation was performed. The collected organic layer was washed with a 1 N hydrochloric acid solution and saturated saline. Then, drying was performed with anhydrous sodium sulfate. The sodium sulfate was separated by filtration to remove the solvent by a rotary evaporator, and purification by silica gel chromatography was performed to obtain 5.4 g of a compound P4-B (yield: 69%).

$^1$H-NMR (solvent: CDCl$_3$) δ (ppm): 2.87 (t, 2H), 3.68-3.82 (m, 8H), 3.90 (t, 2H), 4.18-4.28 (m, 4H), 4.28-4.38 (m, 2H), 4.46-4.54 (m, 2H), 5.84 (dd, 1H), 6.16 (dd, 1H), 6.43 (dd, 1H), 6.90-7.05 (m, 4H), 7.20-7.30 (m, 2H), 7.48-7.65 (m, 4H), 8.10-8.20 (m, 2H)

<Step 3>

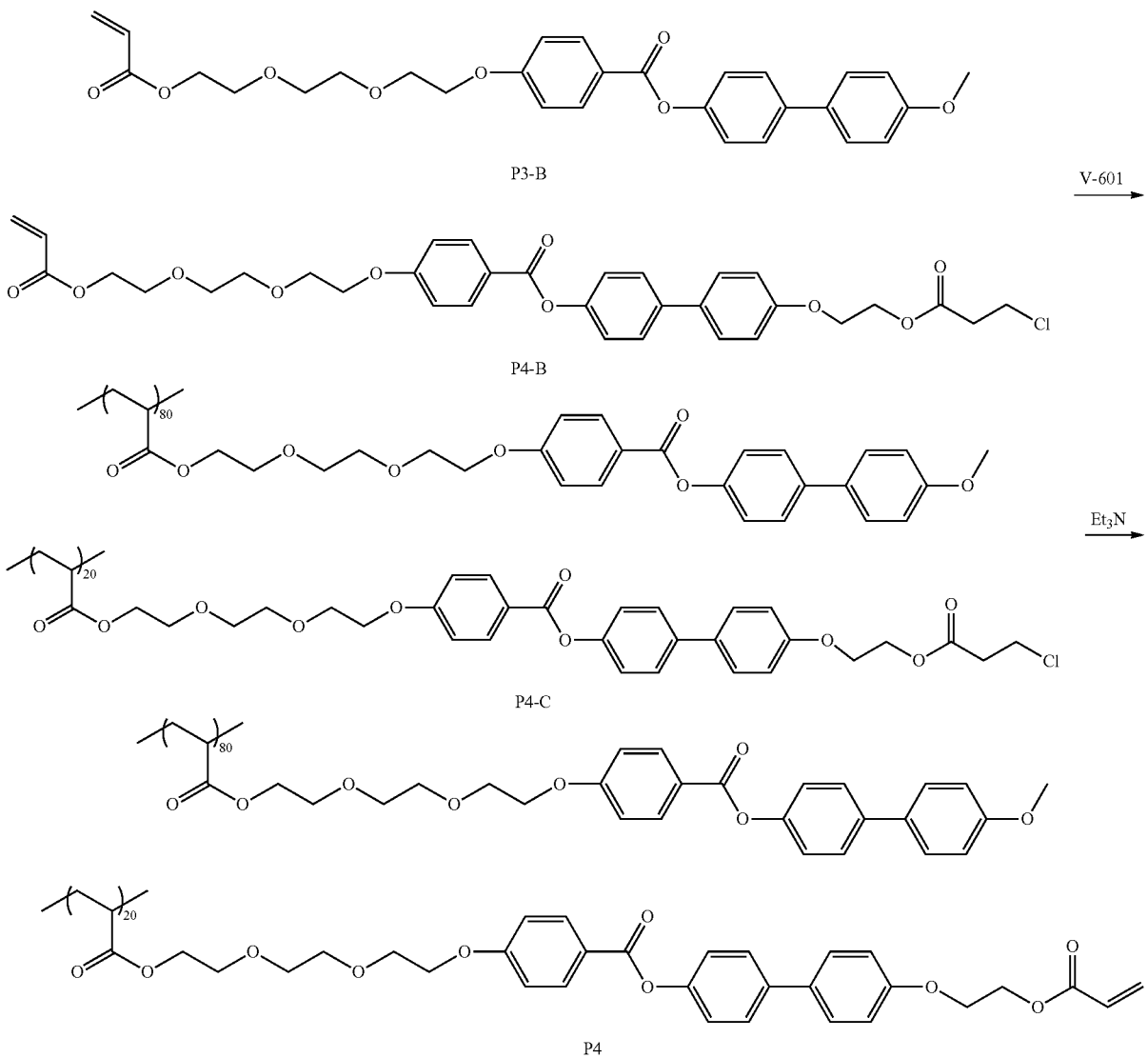

A DMAc solution (3.3 mL) of the compound P3-B (0.8 g) and the compound P4-B (0.2 g) was heated to an internal temperature of 80° C. A DMAc solution (0.5 mL) of 2,2'-azobis(2-methylpropionic acid)dimethyl (0.54 mmol, 0.12 g) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.90 g of a compound P4-C as a white solid. Dibutylhydroxytoluene (BHT) (50 mg) and triethylamine (0.7 ml) were added to a chloroform solution (7 mL) of the obtained compound P4-C and heated to an internal temperature of 50° C. After stirring for 9 hours at 50° C., disappearance of the raw material was confirmed by ¹H-NMR spectrum measurement, and the solution was cooled to room temperature. Methanol was added thereto for filtering, and the residues were washed with methanol to obtain 0.8 g of a polymer liquid crystalline compound P4 as a white solid. The obtained polymer liquid crystalline compound P4 was analyzed by gel permeation chromatography (GPC). A weight-average molecular weight (Mw) was 17,000 (in terms of polystyrene).

Synthesis Example 5

Synthesis of Polymer Liquid Crystalline Compound P5

A polymer liquid crystalline compound P5 was synthesized according to the following step 1 and 2.

<Step 1>

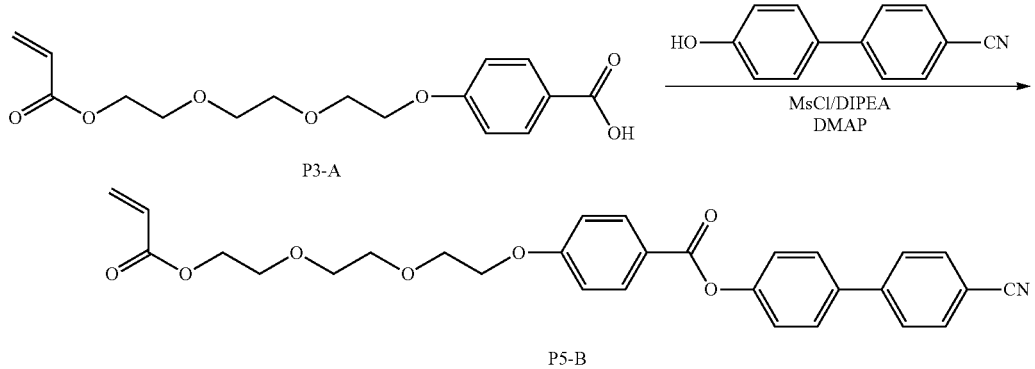

A compound P5-B was synthesized in the same manner as in the case of the compound P3-B, except that 4-hydroxy-4'-cyanobiphenyl was used instead of 4-hydroxy-4'-methoxybiphenyl. The amount of 4-hydroxy-4'-cyanobiphenyl was appropriately adjusted according to the molecular weight.

<Step 2>

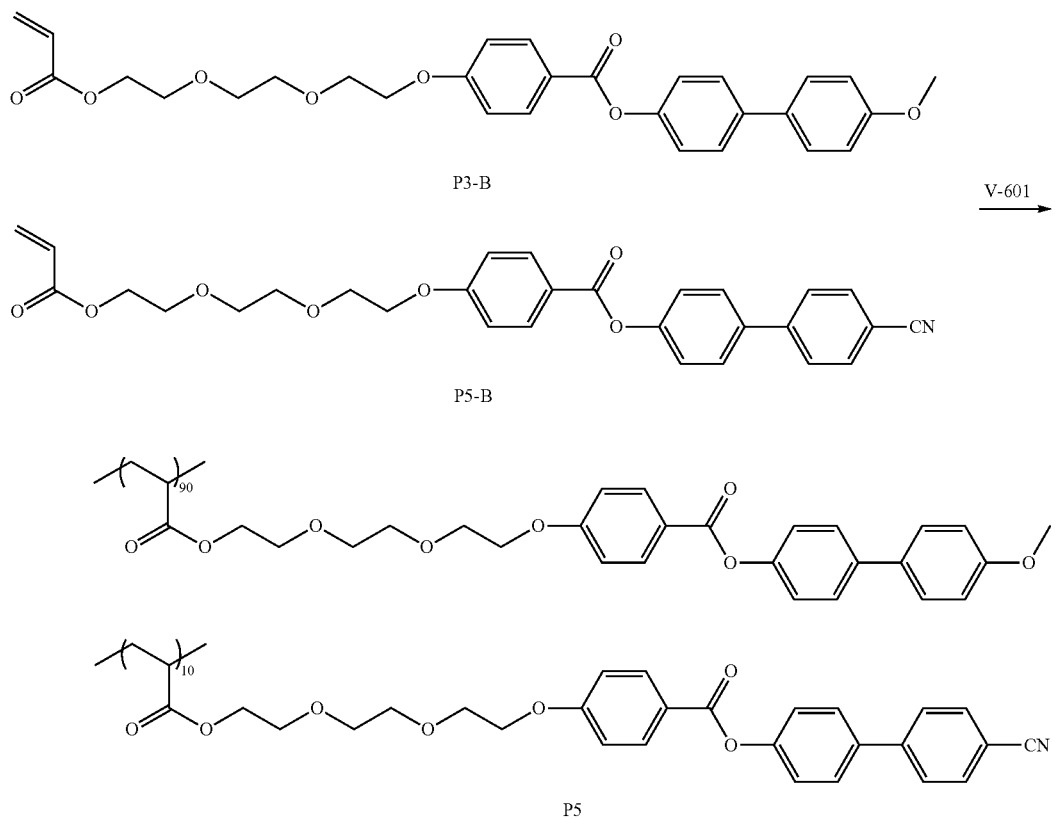

A polymer liquid crystalline compound P5 was synthesized by performing polymerization in the same manner as in the case of the polymer liquid crystalline compound P3, except that the compounds P3-B and P5-B were used as monomers. The amounts of the compounds P3-B and P5-B were appropriately adjusted according to the composition ratio. The obtained polymer liquid crystalline compound P5 was analyzed by gel permeation chromatography (GPC). A weight-average molecular weight (Mw) was 13,000 (in terms of polystyrene).

Synthesis Example 6

Synthesis of Polymer Liquid Crystalline Compound P6

A polymer liquid crystalline compound P6 was synthesized according to the following step 1 and 2.

<Step 1>

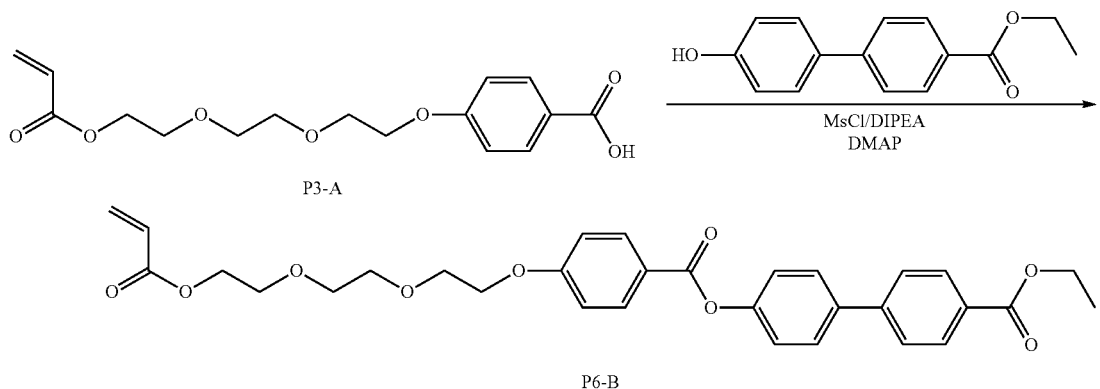

Ethyl 4-(4-hydroxyphenyl)benzoate was synthesized by the method described in Macromolecules, 2002, 35, 1663 to 1671.

A compound P6-B was synthesized in the same manner as in the case of the compound P3-B, except that ethyl 4-(4-hydroxyphenyl)benzoate was used instead of 4-hydroxy-4'-methoxybiphenyl. The amount of ethyl 4-(4-hydroxyphenyl)benzoate was appropriately adjusted according to the molecular weight.

<Step 2>

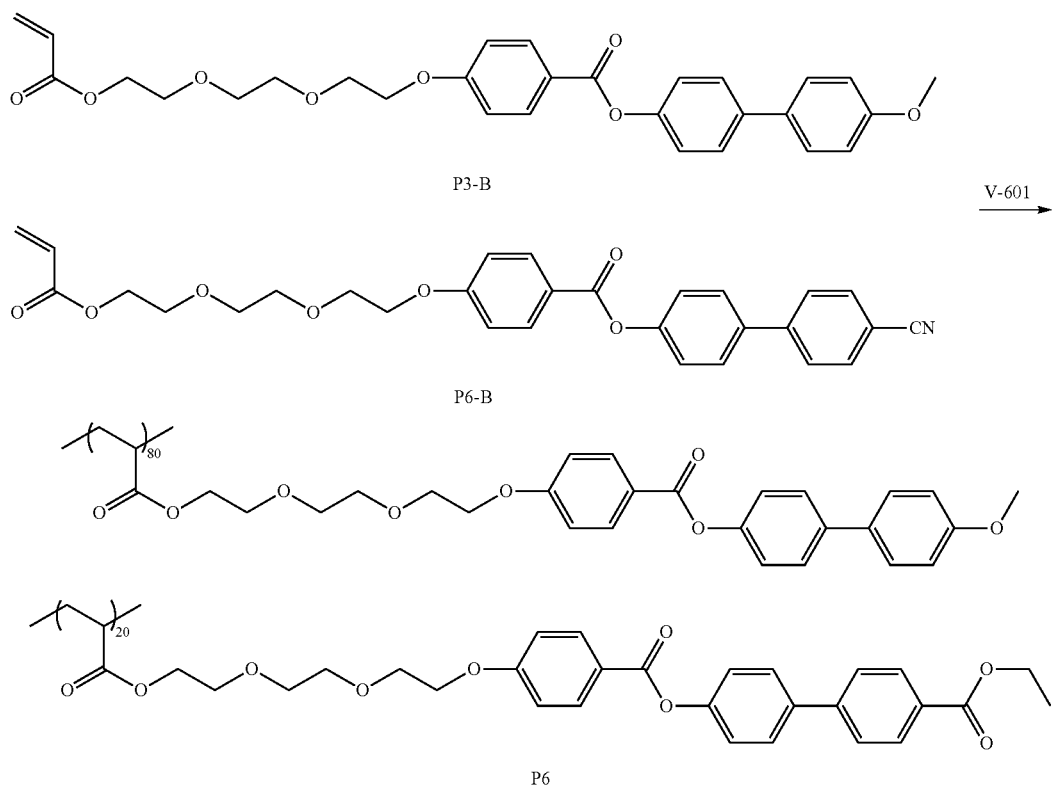

A polymer liquid crystalline compound P6 was synthesized by performing polymerization in the same manner as in the case of the polymer liquid crystalline compound P3, except that the compounds P3-B and P6-B were used as monomers. The amounts of the compounds P3-B and P6-B were appropriately adjusted according to the composition ratio. The obtained polymer liquid crystalline compound P6 was analyzed by gel permeation chromatography (GPC). A weight-average molecular weight (Mw) was 15,000 (in terms of polystyrene).

Synthesis Example 7

Synthesis of Polymer Liquid Crystalline Compound P7

A polymer liquid crystalline compound P7 was synthesized according to the following step 1 and 2.

<Step 1>

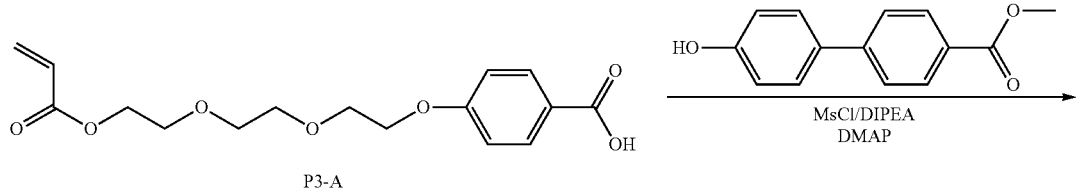

Methyl 4-(4-hydroxyphenyl)benzoate was synthesized by the method described in Macromolecules, 2002, 35, 1663 to 1671.

A compound P7-B was synthesized in the same manner as in the case of the compound P3-B, except that methyl 4-(4-hydroxyphenyl)benzoate was used instead of 4-hydroxy-4'-methoxybiphenyl. The amount of methyl 4-(4-hydroxyphenyl)benzoate was appropriately adjusted according to the molecular weight.

<Step 2>

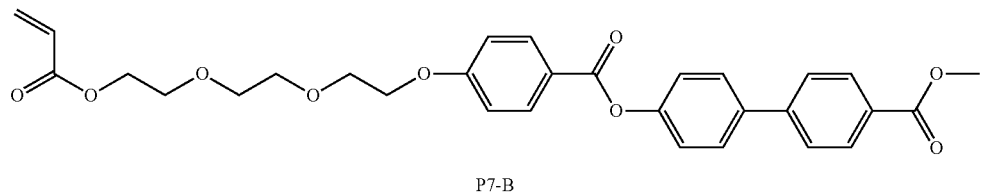

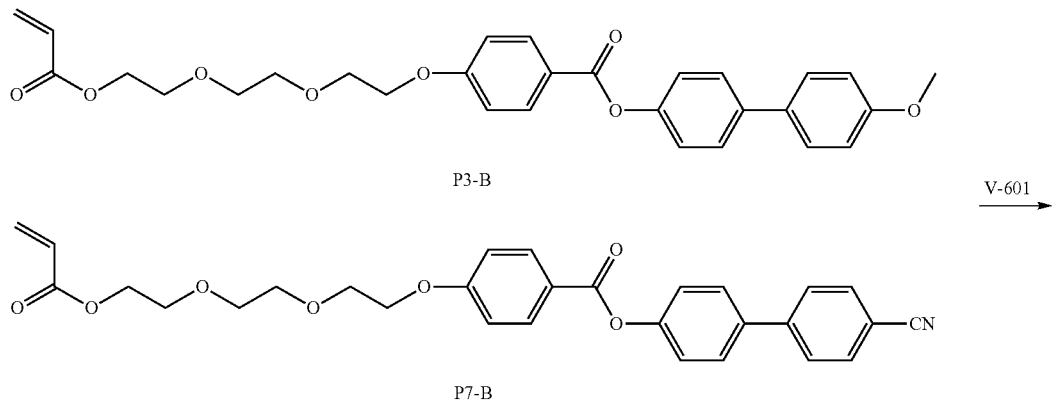

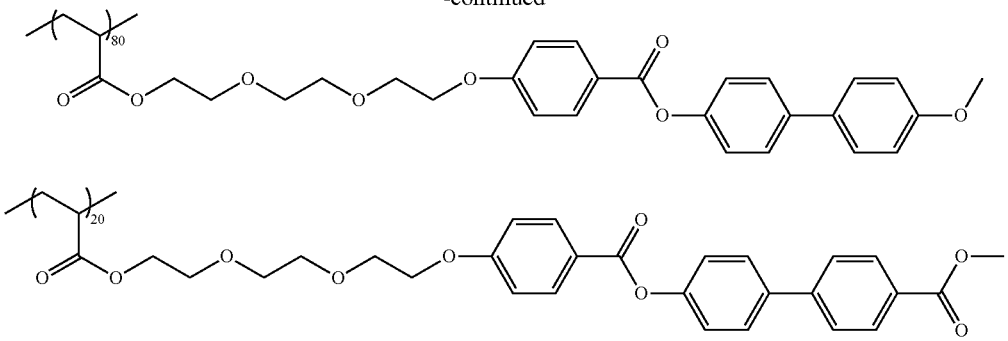

P7

A polymer liquid crystalline compound P7 was synthesized by performing polymerization in the same manner as in the case of the polymer liquid crystalline compound P3, except that the compounds P3-B and P7-B were used as monomers. The amounts of the compounds P3-B and P7-B were appropriately adjusted according to the composition ratio. The obtained polymer liquid crystalline compound P7 was analyzed by gel permeation chromatography (GPC). A weight-average molecular weight (Mw) was 14,000 (in terms of polystyrene).

[Low-Molecular-Weight Liquid Crystalline Compounds, Etc.]

Compounds L1 to L20 shown in the list of the low-molecular-weight liquid crystalline compounds, etc. in the following Tables 1 and 2 were prepared.

Among these compounds, the compounds L1 to L15 are low-molecular-weight liquid crystalline compounds exhibiting liquid crystallinity and having a maximum absorption wavelength of 390 nm or less in a solution as shown in the following Table 1.

TABLE 1

| List of Low-Molecular-Weight Liquid Crystalline Compounds, etc. | Liquid Crystallinity | Melting Point (° C.) | Maximum Absorption Wavelength |
|---|---|---|---|
| L1 | Having Liquid Crystallinity | 80 | 265 nm |
| L2 | Having Liquid Crystallinity | 94 | 278 nm |
| L3 | Having Liquid Crystallinity | 68 | 239 nm |
| L4 | Having Liquid Crystallinity | 105 | 269 nm |
| L5 | Having Liquid Crystallinity | 75 | 319 nm |
| L6 | Having Liquid Crystallinity | 123 | 265 nm |
| L7 | Having Liquid Crystallinity | 148 | 262 nm |

TABLE 1-continued

| | List of Low-Molecular-Weight Liquid Crystalline Compounds, etc. | Liquid Crystallinity | Melting Point (° C.) | Maximum Absorption Wavelength |
|---|---|---|---|---|
| L8 | 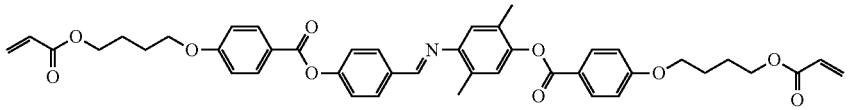 [SMILES: C=CC(=O)OCCCCOc1ccc(C(=O)Oc2ccc(/C=N/c3cc(C)c(OC(=O)c4ccc(OCCCCOC(=O)C=C)cc4)cc3C)cc2)cc1] | Having Liquid Crystallinity | 87 | 275 nm |
| L9 | 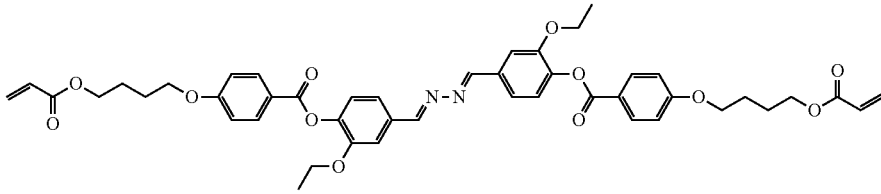 [SMILES: C=CC(=O)OCCCCOc1ccc(C(=O)Oc2ccc(/C=N/N=C/c3ccc(OC(=O)c4ccc(OCCCCOC(=O)C=C)cc4)c(OCC)c3)cc2OCC)cc1] | Having Liquid Crystallinity | 120 | 333 nm |
| L10 | 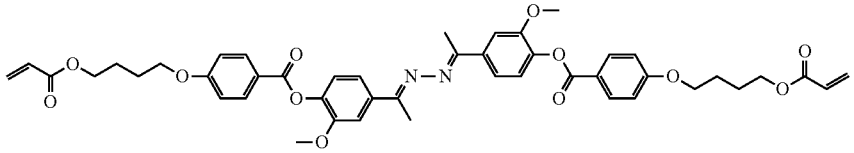 [SMILES: C=CC(=O)OCCCCOc1ccc(C(=O)Oc2ccc(/C(C)=N/N=C(\C)c3ccc(OC(=O)c4ccc(OCCCCOC(=O)C=C)cc4)c(OC)c3)cc2OC)cc1] | Having Liquid Crystallinity | 121 | 270 nm |
| L11 | 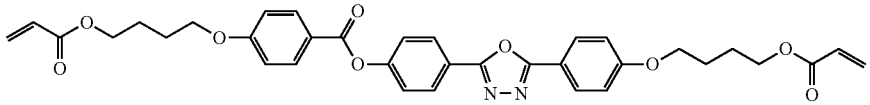 [SMILES: C=CC(=O)OCCCCOc1ccc(C(=O)Oc2ccc(-c3nnc(-c4ccc(OCCCCOC(=O)C=C)cc4)o3)cc2)cc1] | Having Liquid Crystallinity | 100 | 300 nm |
| L12 | 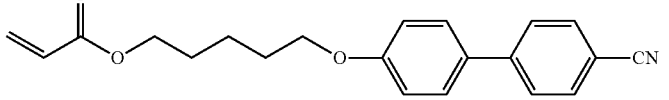 | Having Liquid Crystallinity | 74 | 265 nm |
| L13 | 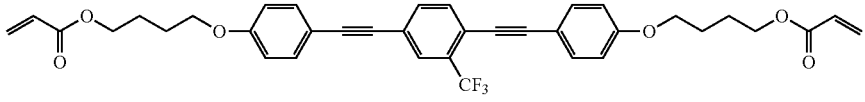 [SMILES: C=CC(=O)OCCCCOc1ccc(C#Cc2ccc(C#Cc3ccc(OCCCCOC(=O)C=C)cc3)c(C(F)(F)F)c2)cc1] | Having Liquid Crystallinity | 63 | 343 nm |
| L14 | 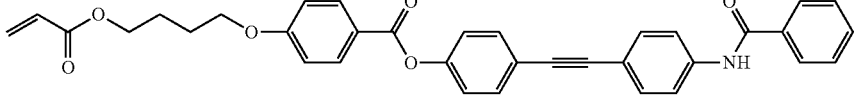 | Having Liquid Crystallinity | 212 | 310 nm |
| L15 | 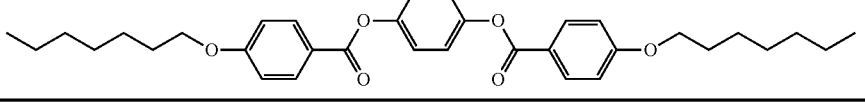 | Having Liquid Crystallinity | 108 | 257 nm |

TABLE 2

| | List of Low-Molecular-Weight Liquid Crystalline Compounds, etc. | Liquid Crystallinity | Melting Point (° C.) | Maximum Absorption Wavelength |
|---|---|---|---|---|
| L16 | 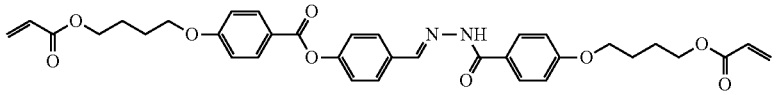 [SMILES: C=CC(=O)OCCCCOc1ccc(C(=O)N/N=C/c2ccc(OC(=O)c3ccc(OCCCCOC(=O)C=C)cc3)cc2)cc1] | No Liquid Crystallinity | — | 268 nm |

TABLE 2-continued

| List of Low-Molecular-Weight Liquid Crystalline Compounds, etc. | Liquid Crystal-linity | Melting Point (° C.) | Maximum Absorption Wavelength |
|---|---|---|---|
| L17 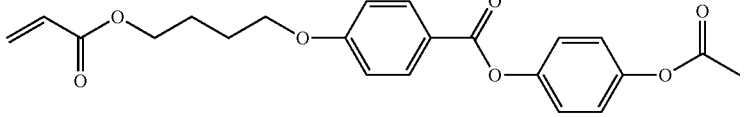 | No Liquid Crystallinity | — | 263 nm |
| L18 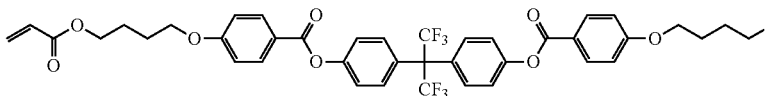 | No Liquid Crystallinity | — | 265 nm |
| L19 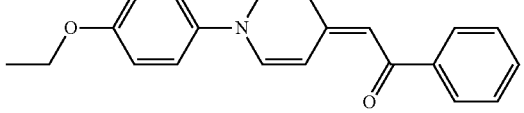 | No Liquid Crystallinity | — | 398 nm |
| L20 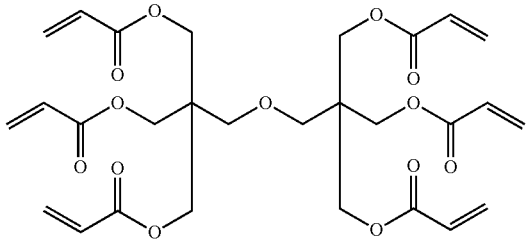 | No Liquid Crystallinity | — | 250 nm or less |

Example 1

[Production of Alignment Film]

A glass base (manufactured by Central Glass Co., Ltd., blue plate glass, size: 300 mm×300 mm, thickness: 1.1 mm) was washed with an alkaline detergent, and then pure water was poured thereto. After that, the glass base was dried.

The following alignment film forming composition 1 was applied to the glass base after the drying using a bar #4. The applied alignment film forming composition 1 was dried for 15 minutes at 80° C., and then heated for 1 hour at 250° C. to form a coating film on the glass base.

The obtained coating film was subjected to a rubbing treatment (1,000 rotations, stage speed: 1.8 m/min) once to produce an alignment film 1 (represented by "PI" in the following Table 3) on the glass base.

| Composition of Alignment Film Forming Composition 1 | |
|---|---|
| SE-130 (product name, manufactured by Nissan Chemical Corporation) | 2.0 parts by mass |
| N-Methylpyrrolidone | 98.0 parts by mass |

[Production of Light Absorption Anisotropic Film]

The obtained alignment film 1 was spin-coated with the following liquid crystal composition 1 by 1,000 rotations to form a coating film.

The coating film was dried for 30 seconds at room temperature, and further heated for 15 seconds at 150° C.

The coating film was cooled to room temperature, and then heated for 1 minute at 80° C. to produce a light absorption anisotropic film 1 on the alignment film 1.

| Composition of Liquid Crystal Composition 1 | |
|---|---|
| Above Polymer Liquid Crystalline Compound P1 | 2.86 parts by mass |
| Following Dichroic Dye Compound D1 | 0.94 parts by mass |
| Above Low-Molecular-Weight Liquid Crystalline Compound L1 | 1.14 parts by mass |
| Polymerization Initiator Irg-819 (manufactured by BASF SE) | 0.04 parts by mass |
| Following Interface Improver F1 | 0.02 parts by mass |
| Chloroform | 95.00 parts by mass |

D1

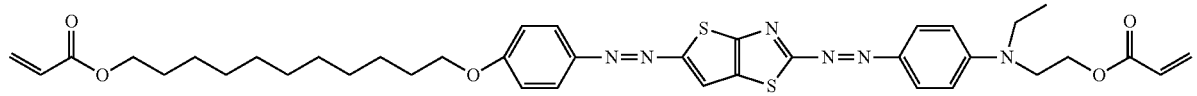

-continued

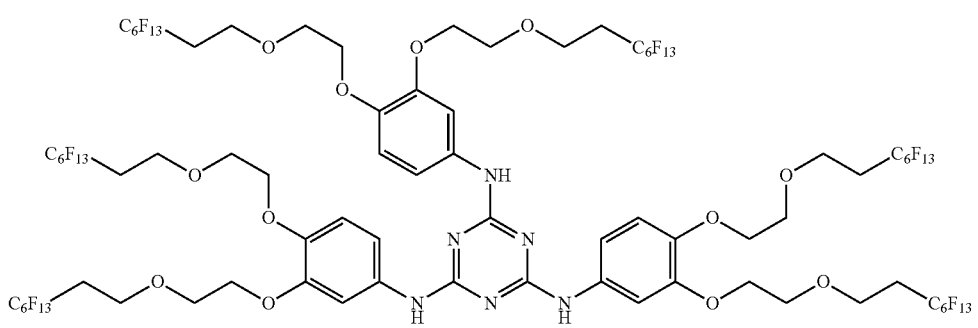

F1

Example 2

[Production of Alignment Film]

A glass base (manufactured by Central Glass Co., Ltd., blue plate glass, size: 300 mm×300 mm, thickness: 1.1 mm) was washed with an alkaline detergent, and then pure water was poured thereto. After that, the glass base was dried.

The following alignment film forming composition 2 was applied to the glass base after the drying using a bar #12. The applied alignment film forming composition 2 was dried for 2 minutes at 110° C. to form a coating film on the glass base.

The obtained coating film was subjected to a rubbing treatment (rotation speed of roller: 1,000 rotations/2.9 mm of spacer thickness, stage speed: 1.8 m/min) once to produce an alignment film 2 (represented by "PVA" in the following Table 3) on the glass base.

| Composition of Alignment Film Forming Composition 2 | |
| --- | --- |
| Following Modified Vinyl Alcohol | 2.00 parts by mass |
| Water | 74.08 parts by mass |
| Methanol | 23.86 parts by mass |
| Photopolymerization Initiator (IRGACURE 2959, manufactured by BASF SE) | 0.06 parts by mass |

(Modified Polyvinyl Alcohol)

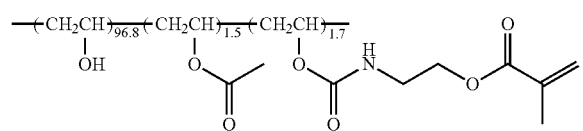

(In the formula, numerical values attached to the repeating units represent a molar ratio of each repeating unit.)

[Production of Light Absorption Anisotropic Film]

The obtained alignment film 2 was spin-coated with the following liquid crystal composition 2 by 1,000 rotations to form a coating film.

The coating film was dried for 30 seconds at room temperature, and further heated for 15 seconds at 150° C.

The coating film was cooled to room temperature, and then heated for 1 minute at 80° C. to produce a light absorption anisotropic film 2 on the alignment film 2.

| Composition of Liquid Crystal Composition 2 | |
| --- | --- |
| Above Polymer Liquid Crystalline Compound P1 | 1.54 parts by mass |
| Above Dichroic Dye Compound D1 | 0.51 parts by mass |
| Above Low-Molecular-Weight Liquid Crystalline Compound L2 | 2.32 parts by mass |
| Polymerization Initiator Irg-819 (manufactured by BASF SE) | 0.02 parts by mass |
| Above Interface Improver F1 | 0.02 parts by mass |
| Chloroform | 95.60 parts by mass |

Examples 3 to 24 and Comparative Examples 1 to 6

A light absorption anisotropic film was produced on the alignment film 1 in the same manner as in Example 1 or 2, except that the kind or the content of the polymer liquid crystalline compound, the dichroic substance, the low-molecular-weight liquid crystalline compound, the polymerization initiator, the interface improver, or the solvent in the liquid crystal composition was changed as shown in the following Tables 3 to 7.

Structural formulae of dichroic substances D2 to D6 will be shown below.

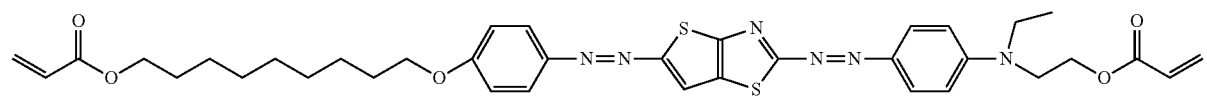

D2

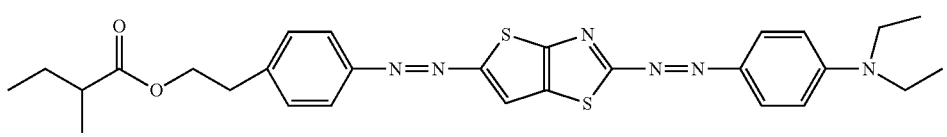

D3

-continued

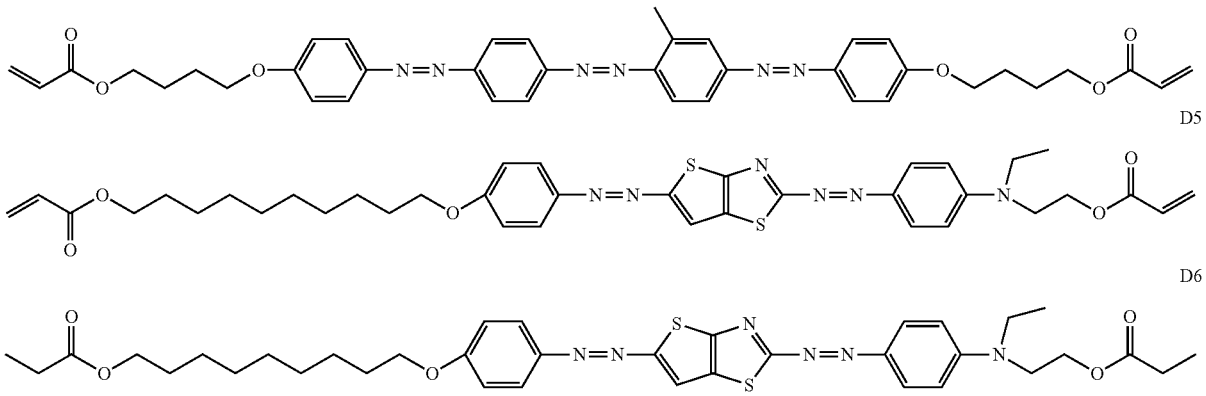

[Evaluation]
<Alignment Degree>

In a state in which a linear polarizer was inserted on the light source side of an optical microscope (manufactured by Nikon Corporation, product name "ECLIPSE E600 POL"), the light absorption anisotropic film of each of the examples and the comparative examples was set on a sample table, and using a multi-channel spectroscope (manufactured by Ocean Optics, Inc., product name "QE65000"), an absorbance of the light absorption anisotropic film in a wavelength region described in the following Tables 3 to 7 was measured to calculate an alignment degree by the following formula. The results are shown in the following Tables 3 to 7.

Alignment Degree: $S=[(Az0/Ay0)-1][(Az0/Ay0)+2]$

Az0: absorbance of light absorption anisotropic film with respect to polarization in absorption axis direction
Ay0: absorbance of light absorption anisotropic film with respect to polarization in polarization axis direction

TABLE 3

| | | Example 1 | Example 2 | Example 3 | Example 4 | Example 5 | Example 6 |
|---|---|---|---|---|---|---|---|
| Kind of Coloring Composition | | Coloring Composition 1 | Coloring Composition 2 | Coloring Composition 3 | Coloring Composition 4 | Coloring Composition 5 | Coloring Composition 6 |
| | Base | Glass | Glass | Glass | Glass | Glass | Glass |
| | Alignment Film | PI | PVA | PVA | PI | PVA | PVA |
| Composition of Coloring Composition | Polymer Liquid Crystalline Compound | P1 | P1 | P2 | P1 | P1 | P2 |
| | Parts by Mass | 2.86 | 1.54 | 2.86 | 2.86 | 2.75 | 2.75 |
| | Dichroic Dye Compound | D1 | D1 | D2 | D2 | D1 | D1 |
| | Parts by Mass | 0.94 | 0.51 | 0.94 | 0.94 | 0.91 | 0.91 |
| | Low-Molecular-Weight Liquid Crystalline Compound | L1 | L2 | L3 | L4 | L5 | L6 |
| | Parts by Mass | 1.14 | 2.32 | 1.14 | 1.14 | 1.25 | 1.25 |
| | Polymerization Initiator | Irg-819 | Irg-819 | Irg-819 | Irg-819 | Irg-907 | Irg-819 |
| | Parts by Mass | 0.04 | 0.02 | 0.04 | 0.04 | 0.07 | 0.07 |
| | Interface Improver | F1 | F1 | F1 | F1 | F1 | F1 |
| | Parts by Mass | 0.02 | 0.02 | 0.02 | 0.02 | 0.02 | 0.02 |
| | Solvent | $CHCl_3$ | $CHCl_3$ | $CHCl_3$ | $CHCl_3$ | $CHCl_3$ | $CHCl_3$ |
| | Parts by Mass | 95.00 | 95.60 | 95.00 | 95.00 | 95.00 | 95.00 |
| Evaluation Results | Measurement Wavelength | 500 to 700 nm | 500 to 700 nm | 500 to 700 nm | 500 to 700 nm | 500 to 700 nm | 500 to 700 nm |
| | Alignment Degree | 0.99 | 0.97 | 0.97 | 0.97 | 0.96 | 0.96 |

TABLE 4

| | | Example 7 | Example 8 | Example 9 | Example 10 | Example 11 | Example 12 |
|---|---|---|---|---|---|---|---|
| Kind of Coloring Composition | | Coloring Composition 7 | Coloring Composition 8 | Coloring Composition 9 | Coloring Composition 10 | Coloring Composition 11 | Coloring Composition 12 |
| | Base | Glass | Glass | Glass | Glass | Glass | Glass |
| | Alignment Film | PVA | PVA | PVA | PVA | PVA | PVA |
| Composition of Coloring Composition | Polymer Liquid Crystalline Compound | P2 | P1 | P1 | P1 | P2 | P1 |
| | Parts by Mass | 2.90 | 2.94 | 3.15 | 3.09 | 3.06 | 2.85 |
| | Dichroic Dye Compound | D1 | D2 | D1 | D1 | D1 | D2 |
| | Parts by Mass | 0.96 | 0.86 | 0.90 | 0.81 | 0.78 | 0.94 |

TABLE 4-continued

|  |  | Example 7 | Example 8 | Example 9 | Example 10 | Example 11 | Example 12 |
|---|---|---|---|---|---|---|---|
|  | Low-Molecular-Weight Liquid Crystalline Compound | L7 | L8 | L9 | L10 | L11 | L12 |
|  | Parts by Mass | 1.09 | 1.11 | 0.89 | 1.05 | 1.12 | 1.28 |
|  | Polymerization Initiator | OXE-01 | Irg-907 | Irg-819 | OXE-02 | OXE-907 | OXE-01 |
|  | Parts by Mass | 0.04 | 0.07 | 0.03 | 0.03 | 0.03 | 0.11 |
|  | Interface Improver | F1 | F1 | F1 | F1 | F1 | F1 |
|  | Parts by Mass | 0.02 | 0.02 | 0.02 | 0.02 | 0.02 | 0.02 |
|  | Solvent | $CHCl_3$ | $CHCl_3$ | $CHCl_3$ | $CHCl_3$ | $CHCl_3$ | $CHCl_3$ |
|  | Parts by Mass | 95.00 | 95.00 | 95.00 | 95.00 | 95.00 | 94.80 |
| Evaluation Results | Measurement Wavelength | 500 to 700 nm | 500 to 700 nm | 500 to 700 nm | 500 to 700 nm | 500 to 700 nm | 500 to 700 nm |
|  | Alignment Degree | 0.95 | 0.99 | 0.95 | 0.97 | 0.95 | 0.97 |

TABLE 5

|  |  | Example 13 | Example 14 | Example 15 | Example 16 | Example 17 | Example 18 |
|---|---|---|---|---|---|---|---|
| Kind of Coloring Composition | | Coloring Composition 13 | Coloring Composition 14 | Coloring Composition 15 | Coloring Composition 16 | Coloring Composition 17 | Coloring Composition 18 |
| | Base | Glass | Glass | Glass | Glass | Glass | Glass |
| | Alignment Film | PVA | PVA | PVA | PVA | PVA | PVA |
| Composition of Coloring Composition | Polymer Liquid Crystalline Compound | P1 | P2 | P3 | P4 | P4 | P4 |
| | Parts by Mass | 2.92 | 2.92 | 2.86 | 3.58 | 3.77 | 3.97 |
| | Dichroic Dye Compound | D1 | D1 | D2 | D2 | D3　D4 | D1 |
| | Parts by Mass | 0.86 | 0.86 | 0.94 | 0.32 | 0.66　0.59 | 0.75 |
| | Low-Molecular-Weight Liquid Crystalline Compound | L13 | L14 | L1 | L1 | L1 | L15 |
| | Parts by Mass | 1.23 | 1.23 | 1.14 | 1.07 | 0.94 | 1.24 |
| | Polymerization Initiator | Irg-819 | Irg-819 | Irg-819 | Irg-819 | Irg-819 | Irg-819 |
| | Parts by Mass | 0.06 | 0.06 | 0.04 | 0.02 | 0.02 | 0.02 |
| | Interface Improver | F1 | F1 | F1 | F1 | F1 | F1 |
| | Parts by Mass | 0.02 | 0.02 | 0.02 | 0.01 | 0.02 | 0.02 |
| | Solvent | $CHCl_3$ | $CHCl_3$ | $CHCl_3$ | $CHCl_3$ | $CHCl_3$ | $CHCl_3$ |
| | Parts by Mass | 94.90 | 94.90 | 95.00 | 95.00 | 94.00 | 94.00 |
| Evaluation Results | Measurement Wavelength | 500 to 700 nm | 500 to 700 nm | 500 to 700 nm | 500 to 700 nm | 500 to 700 nm | 500 to 700 nm |
| | Alignment Degree | 0.96 | 0.93 | 0.98 | 0.98 | 0.97 | 0.97 |

TABLE 6

|  |  | Example 19 | Example 20 | Example 21 | Example 22 | Example 23 | Example 24 |
|---|---|---|---|---|---|---|---|
| Kind of Coloring Composition | | Coloring Composition 19 | Coloring Composition 20 | Coloring Composition 21 | Coloring Composition 22 | Coloring Composition 23 | Coloring Composition 24 |
| | Base | Glass | Glass | Glass | Glass | Glass | Glass |
| | Alignment Film | PVA | PVA | PVA | PVA | PVA | PVA |
| Composition of Coloring Composition | Polymer Liquid Crystalline Compound | P5 | P6 | P7 | P5 | P7 | P6 |
| | Parts by Mass | 4.09 | 4.05 | 3.95 | 3.72 | 3.75 | 3.91 |
| | Dichroic Dye Compound | D6 | D5 | D6 | D5　D4 | D6　D4 | D6　D4 |
| | Parts by Mass | 0.48 | 0.52 | 0.51 | 0.30　0.22 | 0.36　0.21 | 0.34　0.20 |
| | Low-Molecular-Weight Liquid Crystalline Compound | L13 | L14 | L1 | L1 | L1 | L15 |

TABLE 6-continued

|  |  | Example 19 | Example 20 | Example 21 | Example 22 | Example 23 | Example 24 |
|---|---|---|---|---|---|---|---|
|  | Parts by Mass | 0.48 | 0.47 | 0.48 | 0.70 | 0.62 | 0.49 |
|  | Polymerization Initiator | Irg-819 | Irg-819 | Irg-819 | Irg-819 | Irg-819 | Irg-819 |
|  | Parts by Mass | 0.05 | 0.05 | 0.05 | 0.02 | 0.02 | 0.02 |
|  | Interface Improver | F1 | F1 | F1 | F1 | F1 | F1 |
|  | Parts by Mass | 0.02 | 0.02 | 0.02 | 0.02 | 0.02 | 0.02 |
|  | Solvent | CHCl$_3$ | CHCl$_3$ | CHCl$_3$ | CHCl$_3$ | CHCl$_3$ | CHCl$_3$ |
|  | Parts by Mass | 94.90 | 94.90 | 95.00 | 95.00 | 95.00 | 95.00 |
| Evaluation Results | Measurement Wavelength | 500 to 700 nm | 500 to 700 nm | 500 to 700 nm | 400 to 700 nm | 400 to 700 nm | 400 to 700 nm |
|  | Alignment Degree | 0.98 | 0.97 | 0.98 | 0.97 | 0.97 | 0.97 |

TABLE 7

|  |  | Comparative Example 1 | Comparative Example 2 | Comparative Example 3 | Comparative Example 4 | Comparative Example 5 | Comparative Example 6 |
|---|---|---|---|---|---|---|---|
|  | Kind of Coloring Composition | Coloring Composition 25 | Coloring Composition 26 | Coloring Composition 27 | Coloring Composition 28 | Coloring Composition 29 | Coloring Composition 30 |
|  | Base | Glass | Glass | Glass | Glass | Glass | Glass |
|  | Alignment Film | PI | PVA | PVA | PVA | PVA | PVA |
| Composition of Coloring Composition | Polymer Liquid Crystalline Compound | P1 | P2 | P1 | P1 | P2 | P1 |
|  | Parts by Mass | 3.64 | 2.84 | 2.85 | 2.77 | 2.74 | 3.20 |
|  | Dichroic Dye Compound | D1 | D1 | D1 | D1 | D1 | D1 |
|  | Parts by Mass | 1.20 | 0.94 | 0.94 | 0.92 | 0.90 | 1.06 |
|  | Low-Molecular-Weight Liquid Crystalline Compound | — | L16 | L17 | L18 | L19 | L20 |
|  | Parts by Mass | 0.00 | 1.13 | 1.21 | 1.32 | 1.37 | 0.80 |
|  | Polymerization Initiator | Irg-819 | Irg-819 | Irg-819 | Irg-819 | Irg-819 | Irg-819 |
|  | Parts by Mass | 0.14 | 0.07 | 0.07 | 0.07 | 0.07 | 0.12 |
|  | Interface Improver | F1 | F1 | F1 | F1 | F1 | F1 |
|  | Parts by Mass | 0.03 | 0.02 | 0.02 | 0.02 | 0.02 | 0.03 |
|  | Solvent | CHCl$_3$ | CHCl$_3$ | CHCl$_3$ | CHCl$_3$ | CHCl$_3$ | CHCl$_3$ |
|  | Parts by Mass | 95.00 | 95.00 | 94.90 | 94.90 | 94.90 | 94.80 |
| Evaluation Results | Measurement Wavelength | 500 to 700 nm | 500 to 700 nm | 500 to 700 nm | 500 to 700 nm | 500 to 700 nm | 500 to 700 nm |
|  | Alignment Degree | 0.90 | 0.76 | 0.88 | 0.84 | 0.65 | 0.53 |

From the results shown in Tables 3 to 7, it has been found that an alignment degree of a light absorption anisotropic film to be obtained is reduced in a case where a liquid crystal composition prepared without blending a low-molecular-weight liquid crystalline compound is used (Comparative Example 1).

It has been found that an alignment degree of a light absorption anisotropic film to be obtained is more reduced than in Comparative Example 1 in a case where a liquid crystal composition prepared by blending a polymerizable compound having no liquid crystallinity instead of a low-molecular-weight liquid crystalline compound is used (Comparative Examples 2 to 6).

In contrast, it has been found that an alignment degree of a light absorption anisotropic film to be obtained is improved in a case where a liquid crystal composition prepared by blending a low-molecular-weight liquid crystalline compound having a maximum absorption wavelength of 390 nm or less in a solution together with a polymer liquid crystalline compound is used (Examples 1 to 24).

Particularly, from the results of Examples 6, 7, 11, and 14, it has been found that the alignment degree of the light absorption anisotropic film further increases in a case where the upper limit temperature at which the liquid crystal phase is exhibited, that is, the melting point is 200° C. or lower.

What is claimed is:

1. A light absorption anisotropic film consisting of a cured product of a liquid crystal composition, wherein the liquid crystal composition comprises:

a linear polymer liquid crystalline compound having a repeating unit;

a low-molecular-weight liquid crystalline compound having a maximum absorption wavelength of 390 nm or less in a solution; and a dichroic substance, wherein the polymer liquid crystalline compound has a repeating unit represented by Formula (1),

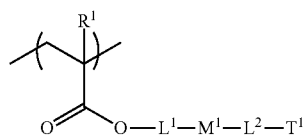
(1)

in Formula (1), $R^1$ represents a hydrogen atom or a methyl group, $L^1$ and $L^2$ each independently represent a single bond or a divalent linking group, the divalent linking group represents an alkylene group having 1 to 30 carbon atoms, or one or more —$CH_2$— moieties constituting the alkylene group may be substituted by —O—, —$(CH_2)_n$—, —$(CF_2)_n$—, —$Si(CH_2)_n$—, —$(Si(CH_3)_2O)_n$—, —N(Z)—, —C(Z)=C(Z')—, —C(Z)=N—, —N=C(Z)—, —$C(Z)_2$—$C(Z')_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—, —C≡C—, —S—, —S(O)—, —S(O)(O)—, —(O)S(O)O—, —O(O)S(O)O—, —SC(O)—, or —C(O)S—, n represents an integer of 1 to 3, Z, Z', and Z" each independently represent a hydrogen atom, an alkyl group having 1 to 4 carbon atoms, a cycloalkyl group, an aryl group, a cyano group, or a halogen atom, $M^1$ represents a mesogenic group represented by Formula (1-1), and $T^1$ represents a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

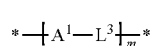
(1-1)

in Formula (1-1), $A^1$ represents a divalent group selected from the group consisting of an aromatic hydrocarbon group, a heterocyclic group, and an alicyclic group which may have a substituent, $L^3$ represents a single bond or a divalent linking group, the divalent linking group represents —O—, —$(CH_2)_g$—, —$(CF_2)_g$—, —$Si(CH_3)_2$—, —$(Si(CH_3)_2O)_g$—, —$(OSi(CH_3)_2)_g$—, —N(Z)—, —C(Z)=C(Z')—, —C(Z)=N—, —N=C(Z)—, —$C(Z)_2$—$C(Z')_2$—, —C(O)—, —OC(O)—, —C(O)O—, —O—C(O)O—, —N(Z)C(O)—, —C(O)N(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—, —C≡C—, —S—, —S(O)—, —S(O)(O)—, —(O)S(O)O—, —O(O)S(O)O—, —SC(O)—, —C(O)S—, or Groups obtained by combining two or more of the above groups, g represents an integer of 1 to 10, Z, Z', and Z" each independently represent a hydrogen atom, an alkyl group having 1 to 4 carbon atoms, a cycloalkyl group, an aryl group, a cyano group, or a halogen atom, m represents an integer of 1 to 10, and * represents a bonding position to $L^1$ or $L^2$, and in a case where m is an integer of 2 to 10, a plurality of $A^1$'s may be the same or different, and a plurality of $L^3$'s may be the same or different, wherein the low-molecular-weight liquid crystalline compound has a structure represented by Formula (2), $T^2$-$L^1$-$M^1$-$L^2$-$T^1$ (2)

in Formula (2), $L^1$ and $L^2$ each independently represent a single bond or a divalent linking group, $M^1$ represents a mesogenic group represented by Formula (2-1), and $T^1$ and $T^2$ each independently represent a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

(2-1)

in Formula (2-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 3 to 10, and * represents a bonding position to $L^1$ or $L^2$, and in a case where m is an integer of 3 to 10, a plurality of $A^1$'s may be the same or different, and a plurality of $L^3$'s may be the same or different, wherein the content of the dichroic substance is 4 to 200 parts by mass with respect to 100 parts by mass of the polymer liquid crystalline compound, and wherein the content of the dichroic substance is 2 to less than 30 mass % in the solid content of the liquid crystal composition.

2. The light absorption anisotropic film according to claim 1,
wherein $L^1$ in Formula (1) has an oxyalkylene structure.

3. A polarizing plate comprising:
a base; and
a light absorption anisotropic film consisting of a cured product of a liquid crystal composition, provided on the base,
wherein the liquid crystal composition comprises
a linear polymer liquid crystalline compound having a repeating unit;

a low-molecular-weight liquid crystalline compound having a maximum absorption wavelength of 390 nm or less in a solution; and
a dichroic substance,
wherein the polymer liquid crystalline compound has a repeating unit represented by Formula (1),

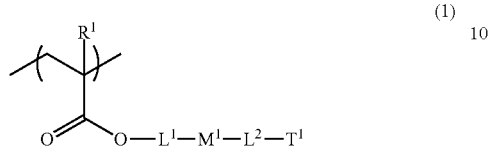 (1)

in Formula (1), $R^1$ represents a hydrogen atom or a methyl group, $L^1$ and $L^2$ each independently represent a single bond or a divalent linking group, the divalent linking group represents an alkylene group having 1 to 30 carbon atoms, or one or more —CH$_2$— moieties constituting the alkylene group may be substituted by —O—, —(CH$_2$)$_n$—, —(CF$_2$)$_n$—, —Si(CH$_2$)$_n$—, —(Si(CH$_3$)$_2$O)$_n$—, —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—, —C≡C—, —S—, —S(O)—, —S(O)(O)—, —(O)S(O)O—, —O(O)S(O)O—, —SC(O)—, or —C(O)S—, n represents an integer of 1 to 3, Z, Z', and Z" each independently represent a hydrogen atom, an alkyl group having 1 to 4 carbon atoms, a cycloalkyl group, an aryl group, a cyano group, or a halogen atom, $M^1$ represents a mesogenic group represented by Formula (1-1), and $T^1$ represents a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (1-1)

in Formula (1-1), $A^1$ represents a divalent group selected from the group consisting of an aromatic hydrocarbon group, a heterocyclic group, and an alicyclic group which may have a substituent, $L^3$ represents a single bond or a divalent linking group, the divalent linking group represents —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$—, —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—, —C≡C—, —S—, —S(O)—, —S(O)(O)—, —(O)S(O)O—, —O(O)S(O)O—, —SC(O)—, —C(O)S—, or Groups obtained by combining two or more of the above groups, g represents an integer of 1 to 10, Z, Z', and Z" each independently represent a hydrogen atom, an alkyl group having 1 to 4 carbon atoms, a cycloalkyl group, an aryl group, a cyano group, or a halogen atom, m represents an integer of 1 to 10, and * represents a bonding position to $L^1$ or $L^2$, and
in a case where m is an integer of 2 to 10, a plurality of $A^1$'s may be the same or different, and a plurality of $L^3$'s may be the same or different,
wherein the low-molecular-weight liquid crystalline compound has a structure represented by Formula (2), $T^2\text{-}L^1\text{-}M^1\text{-}L^2\text{-}T^1$ (2)

in Formula (2), $L^1$ and $L^2$ each independently represent a single bond or a divalent linking group, $M^1$ represents a mesogenic group represented by Formula (2-1), and $T^1$ and $T^2$ each independently represent a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (2-1)

in Formula (2-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$, and
in a case where m is an integer of 2 to 10, a plurality of $A^1$'s may be the same or different, and a plurality of $L^3$'s may be the same or different, and
wherein the content of the dichroic substance is 2 to less than 30 mass % in the solid content of the liquid crystal composition.

4. The polarizing plate according to claim 3, further comprising:
a λ/4 plate provided on the light absorption anisotropic film.

5. An image display device comprising:
the light absorption anisotropic film according to claim 1.

6. An image display device comprising:
the polarizing plate according to claim 3.

7. An image display device comprising:
the polarizing plate according to claim 4.

8. The polarizing plate according to claim 3,
wherein $L^1$ in Formula (1) has an oxyalkylene structure.

9. A light absorption anisotropic film consisting cured product of a liquid crystal composition,
wherein the liquid crystal composition comprises
a linear polymer liquid crystalline compound having a repeating unit;
a low-molecular-weight liquid crystalline compound having a maximum absorption wavelength of 390 nm or less in a solution; and
a dichroic substance,
wherein the polymer liquid crystalline compound has a repeating unit represented by Formula (1),

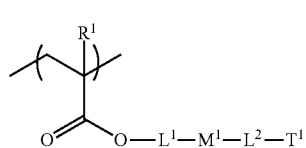 (1)

in Formula (1), $R^1$ represents a hydrogen atom or a methyl group, $L^1$ and $L^2$ each independently represent a single bond or a divalent linking group, $M^1$ represents a mesogenic group represented by Formula (1-1), and $T^1$ represents a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (1-1)

in Formula (1-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$, and
in a case where m is an integer of 2 to 10, a plurality of $A^1$'s may be the same or different, and a plurality of $L^3$'s may be the same or different,
wherein the low-molecular-weight liquid crystalline compound has a structure represented by Formula (2),

 (2)

in Formula (2), $L^1$ and $L^2$ each independently represent a single bond or a divalent linking group, $M^1$ represents a mesogenic group represented by Formula (2-1), and $T^1$ and $T^2$ each independently represent a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (2-1)

in Formula (2-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 3 to 10, and * represents a bonding position to $L^1$ or $L^2$, and
in a case where m is an integer of 3 to 10, a plurality of $A^1$'s may be the same or different, and a plurality of $L^3$'s may be the same or different,
wherein the dichroic substance is a compound having a structure represented by Formula (3), $L^4$-$A^2$-N=N-$A^3$-N=N-$A^4$-$L^5$ (3)

in Formula (3), $A^2$, $A^3$, and $A^4$ each independently represent a divalent aromatic group which may have a substituent, any one of $A^2$, $A^3$, or $A^4$ represents a divalent thienothiazole group which may have a substituent, $L^4$ and $L^5$ each independently represent a substituent which does not include an aryl group, at least one of $L^4$ and $L^5$ represents a substituent which does not include an aryl group and which includes a crosslinkable group,
wherein the content of the dichroic substance is 4 to 200 parts by mass with respect to 100 parts by mass of the polymer liquid crystalline compound, and
wherein the content of the dichroic substance is 2 to less than 30 mass % in the solid content of the liquid crystal composition.

10. A polarizing plate comprising:
a base; and
a light absorption anisotropic film consisting cured product of a liquid crystal composition, provided on the base,
wherein the liquid crystal composition comprises
a linear polymer liquid crystalline compound having a repeating unit;
a low-molecular-weight liquid crystalline compound having a maximum absorption wavelength of 390 nm or less in a solution; and
a dichroic substance,
wherein the polymer liquid crystalline compound has a repeating unit represented by Formula (1),

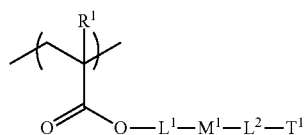 (1)

in Formula (1), $R^1$ represents a hydrogen atom or a methyl group, $L^1$ and $L^2$ each independently represent a single bond or a divalent linking group, $M^1$ represents a mesogenic group represented by Formula (1-1), and $T^1$ represents a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (1-1)

in Formula (1-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$, and in a case where m is an integer of 2 to 10, a plurality of $A^1$'s may be the same or different, and a plurality of $L^3$'s may be the same or different, wherein the low-molecular-weight liquid crystalline compound has a structure represented by Formula (2),

 (2)

in Formula (2), $L^1$ and $L^2$ each independently represent a single bond or a divalent linking group, $M^1$ represents a mesogenic group represented by Formula (2-1), and $T^1$ and $T^2$ each independently represent a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, or an ureido group having 1 to 10 carbon atoms, these groups may be further substituted by these groups or the polymerizable groups,

 (2-1)

in Formula (2-1), $A^1$ represents a divalent group selected from the group consisting of an aromatic hydrocarbon group, a heterocyclic group, and an alicyclic group which may have a substituent, $L^3$ represents a single bond or a divalent linking group, m represents an integer of 1 to 10, and * represents a bonding position to $L^1$ or $L^2$, and in a case where m is an integer of 2 to 10, a plurality of $A^1$'s may be the same or different, and a plurality of $L^3$'s may be the same or different, wherein the dichroic substance is a compound having a structure represented by Formula (3), $L^4\text{-}A^2\text{-}N{=}N\text{-}A^3\text{-}N{=}N\text{-}A^4\text{-}L^5$ (3)

in Formula (3), $A^2$, $A^3$, and $A^4$ each independently represent a divalent aromatic group which may have a substituent, any one of $A^2$, $A^3$, or $A^4$ represents a divalent thienothiazole group which may have a substituent, $L^4$ and $L^5$ each independently represent a substituent which does not include an aryl group, at least one of $L^4$ and $L^5$ represents a substituent which does not include an aryl group and which includes a crosslinkable group, and wherein the content of the dichroic substance is 2 to less than 30 mass % in the solid content of the liquid crystal composition.

11. An image display device comprising:
the light absorption anisotropic film according to claim 9.
12. An image display device comprising:
the polarizing plate according to claim 10.

* * * * *